US007005329B2

(12) United States Patent
Shin

(10) Patent No.: US 7,005,329 B2
(45) Date of Patent: Feb. 28, 2006

(54) METHOD FOR MANUFACTURING SEMICONDUCTOR DEVICE

(75) Inventor: Yong Chul Shin, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 36 days.

(21) Appl. No.: 10/889,919

(22) Filed: Jul. 13, 2004

(65) Prior Publication Data

US 2005/0118763 A1 Jun. 2, 2005

(30) Foreign Application Priority Data

Nov. 28, 2003 (KR) ...................... 10-2003-0085792
Dec. 23, 2003 (KR) ...................... 10-2003-0095562

(51) Int. Cl.
*H01L 21/00* (2006.01)

(52) U.S. Cl. ...................................... 438/149; 438/455

(58) Field of Classification Search ................ 438/455, 438/149

See application file for complete search history.

(56) References Cited

U.S. PATENT DOCUMENTS 5,523,254 A * 6/1996 Satoh et al. ................ 438/457
6,232,155 B1 * 5/2001 Lee ............................ 438/149

* cited by examiner

*Primary Examiner*—Thao P. Le
(74) *Attorney, Agent, or Firm*—Ladas & Parry LLP

(57) ABSTRACT

Disclosed is a method for manufacturing a semiconductor device. The method comprises the steps of: providing a first substrate and a second substrate; forming a capacitor and a gate line on a first surface of the first substrate; forming an insulating layer on a resultant structure of the first substrate; bonding the second substrate to the insulating layer of the first substrate; turning a resultant structure over in such a manner that a second surface of the first substrate is an upper surface of the resultant structure; polishing the second surface of the first substrate by a predetermined thickness; forming an isolation layer for defining an active region by performing an isolation process with respect to the second surface of the first substrate for which a polishing process is finished; and forming a bit line on the active region in the first substrate.

11 Claims, 29 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a method for manufacturing a semiconductor device, which can simplify fabricating processes for the semiconductor device.

2. Description of the Prior Art

Generally, a fabricating process for DRAMs of semiconductor devices is performed in an order of an isolation process, a gate electrode forming process, a bit line forming process, a capacitor forming process, and a metal wiring forming process.

FIGS. 1 and 2 show layout views for explaining a conventional method for manufacturing a semiconductor device. Herein, FIG. 1 shows a layout view of a semiconductor device for which a gate forming process and a landing plug forming process have been carried out. FIG. 2 shows a layout view of a semiconductor device for which a bit line contact forming process, a bit line forming process, a storage node contact forming process, and a storage node electrode forming process have been carried out after the gate forming and landing plug forming processes described with reference to FIG. 1.

Also, FIGS. 3*a* to 3*i* are sectional views taken along an A-B line shown in FIGS. 1 and 2. FIGS. 4*a* to 4*e* are sectional views taken along a C-D line shown in FIGS. 1 and 2. In addition, FIGS. 5*a* to 5*d* are sectional views taken along an E-F line shown in FIGS. 1 and 2.

As shown in FIGS. 1, 3*a*, and 4*a*, according to the conventional method for manufacturing a semiconductor device, a semiconductor substrate 1 having a field region (not shown) and an active region (not shown) is prepared. Subsequently, a shallow trench isolation (STI) process is performed with respect to the field region of the substrate 1, thereby forming an isolation layer. 2.

Then, as shown in FIGS. 1, 3*b*, and 4*b*, after forming a gate line 3 on the substrate including the isolation layer 2, a first insulating layer 4 for covering a structure of the gate line 3 is formed. After that, an ion implantation process is carried out with respect to an entire substrate by using the gate line 3 as a mask, thereby forming source/drain regions (S1/D1) between gate lines 3 formed on a lower substrate (shown in FIG. 1).

After that, as shown in FIGS. 3*c* and 4*c*, after performing a CMP process for the first insulating layer 4, the first insulating layer 4 is selectively etched, thereby forming a contact hole 5 for exposing the source region or the drain region. Subsequently, a conductive plug 6 filling the contact hole 5 is formed.

Then, as shown in FIG. 3*d*, after forming a second insulating layer 7 on an entire surface of the substrate including the conductive plug 6, the second insulating layer 7 is selectively etched as shown in FIG. 4*d*, thereby forming a bit line contact 8 for exposing the conductive plug 6.

After that, as shown in FIGS. 3*e* and 4*e*, after forming a bit line 9 for filling the bit line contact 8, a third insulating layer 10 is formed on an entire surface of a structure of the bit line 9. At this time, although it is not shown, an insulating spacer is formed at a side of the bit line 9, thereby preventing the bit line 9 from being subject to a circuit-short in relation to a capacitor during next processes.

Subsequently, as shown in FIGS. 3*f* and 5*a*, after forming a storage node contact 11 by selectively etching the third insulating layer and the second insulating layer, a landing plug 12 filling the storage node contact 11 is formed as shown in FIGS. 3*g* and 5*b*.

Then, as shown in FIGS. 3*h* and 5*c*, a fourth insulating layer 13 is formed on an entire surface of the substrate including the landing plug 12.

After that, as shown in FIGS. 3*i* and 5*d*, after forming a contact hole 14 for exposing the landing plug 12 by selectively etching the fourth insulating layer, a storage node electrode 15 of a capacitor is formed in such a manner that the storage node electrode 15 is connected to the landing plug 12 while covering an inner wall of the contact hole 14. After that, a dielectric layer 16 and a plate electrode 17 are sequentially formed such that the storage node electrode 15 of the capacitor is covered with the dielectric layer 16 and a plate electrode 17.

Generally, since a bit line is aligned perpendicularly to a gate line, and a bit line contact must connect the bit line to a source region, it is preferred that the bit line contact is formed at the center of the source region.

However, according to a conventional process for manufacturing a semiconductor device, although a gate line forming process, a bit line forming process, and a capacitor forming process are sequentially performed after an isolation process, it is difficult to ideally align the bit line contact with respect to the source region, because the bit line passes over a drain region for forming the capacitor.

Also, since a bit line contact of a cell area cannot be simultaneously etched together with a bit line contact of a peripheral circuit area, a bit line contact process is performed twice. Accordingly, the process for manufacturing the semiconductor device is complicated. In addition, a landing plug is also formed in a drain of an active region so as to fabricate a capacitor connected to the drain by means of the landing plug, so that an additional landing plug forming process must be performed. Therefore, the process for manufacturing the semiconductor device is further complicated.

SUMMARY OF THE INVENTION

Accordingly, the present invention has been made to solve the above-mentioned problems occurring in the prior art, and an object of the present invention is to provide a method for manufacturing a semiconductor device, in which a capacitor is formed on a first surface of a first substrate, a second substrate is bonded to a second surface of the first substrate having the capacitor, and an isolation process, a gate line forming process, and a bit line forming process are sequentially performed with respect to the first and second substrates, so that an additional landing plug is not required, and the bit line contact forming process may be achieved at a time, rather than two times, thereby simplifying a semiconductor fabricating process.

In order to accomplish this object, there is provided a method for manufacturing a semiconductor device, the method comprising the steps of: providing a first substrate and a second substrate; forming a capacitor and a gate line on a first surface of the first substrate; forming an insulating layer on a resultant structure of the first substrate; bonding the second substrate to the insulating layer of the first substrate; turning a resultant structure over in such a manner that a second surface of the first substrate is an upper surface of the resultant structure; polishing the second surface of the first substrate by a predetermined thickness; forming an isolation layer for defining an active region by performing an isolation process with respect to the second surface of the first substrate for which an polishing process is finished; and forming a bit line on the active region in the first substrate.

It is preferred that the second substrate is any one selected from a group consisting of a silicon wafer, a glass substrate, and a plastic substrate.

It is preferred that the active region is patterned in such a manner that the active region of each column is uniformly aligned in match with each row.

Meanwhile, in order to accomplish this object, there is provided a method for manufacturing a semiconductor device, the method comprising the steps of providing a first substrate and a second substrate; forming a capacitor on a first surface of the first substrate; forming a first insulating layer on the first substrate including the capacitor bonding the second substrate to the first insulating layer of the first substrate; turning a resultant structure over in such a manner that a second surface of the first substrate is an upper surface of the resultant structure; polishing the second surface of the first substrate by a predetermined thickness; forming an isolation layer for defining an active region by performing an isolation process with respect to the first substrate in which a polishing process is finished; and forming sequentially a bit line and a gate line on the active region in the first substrate. Herein, the second substrate is any one selected from a group consisting of a silicon wafer, a glass substrate, and a plastic substrate.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
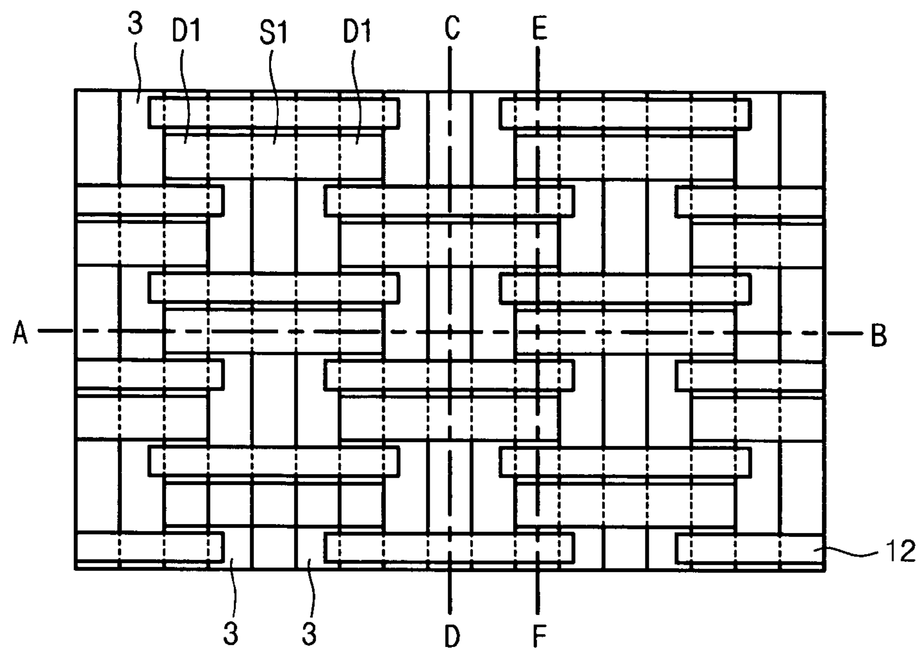
FIGS. 1 and 2 show layout views for explaining a conventional method for manufacturing a semiconductor device.
Figure 2:
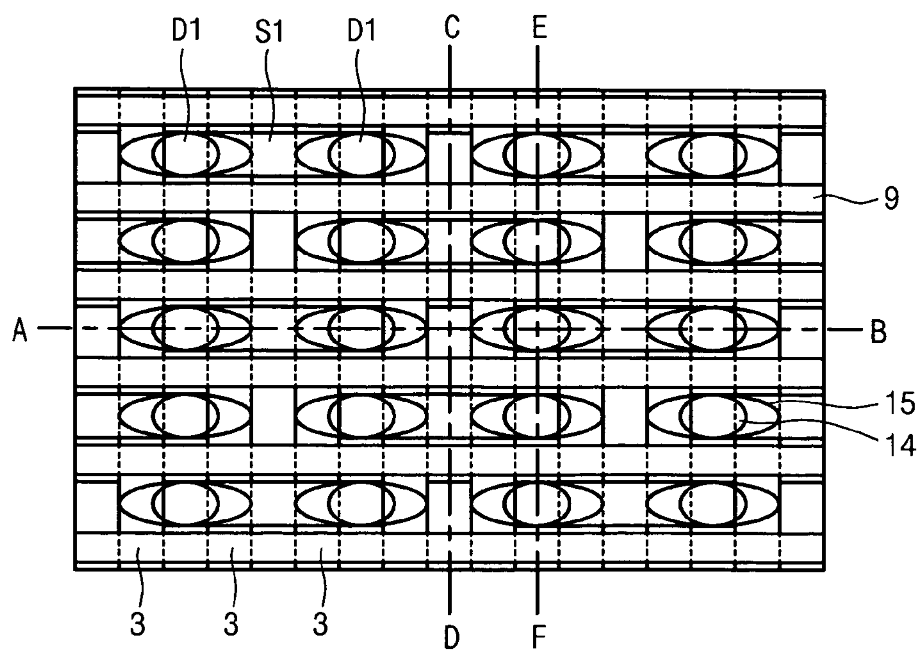
Figure 3A:
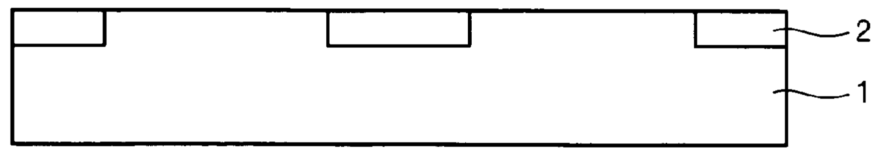
FIGS. 3*a* to 3*i* are sectional views taken along an A-B line shown in FIGS. 1 and 2.
Figure 3B:
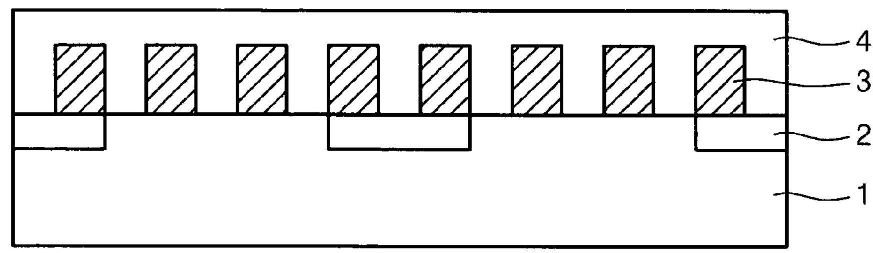
Figure 3C:
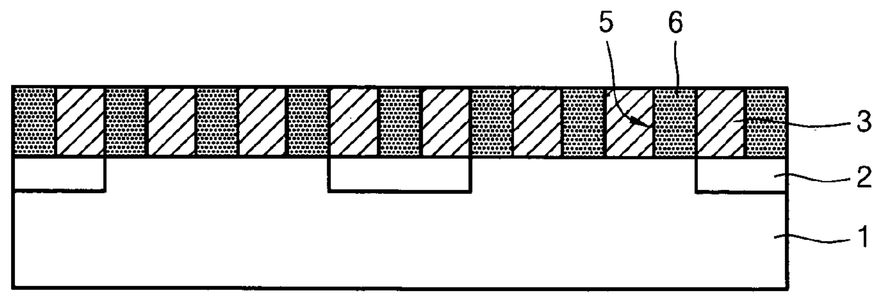
Figure 3D:
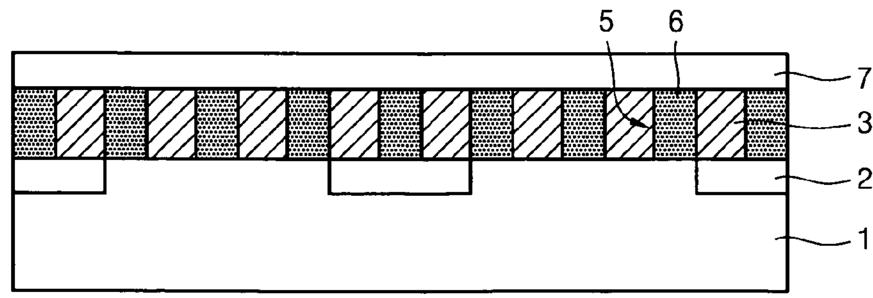
Figure 3E:
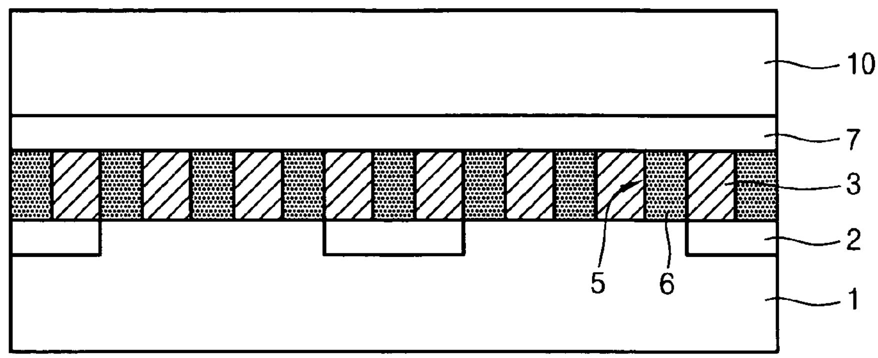
Figure 3F:
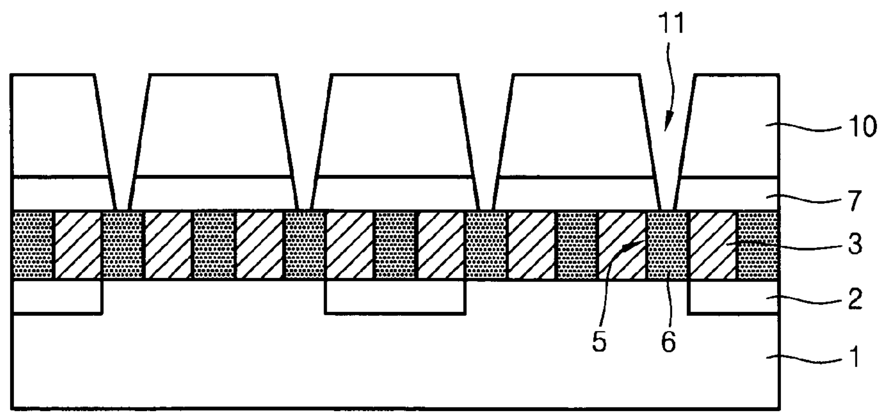
Figure 3G:
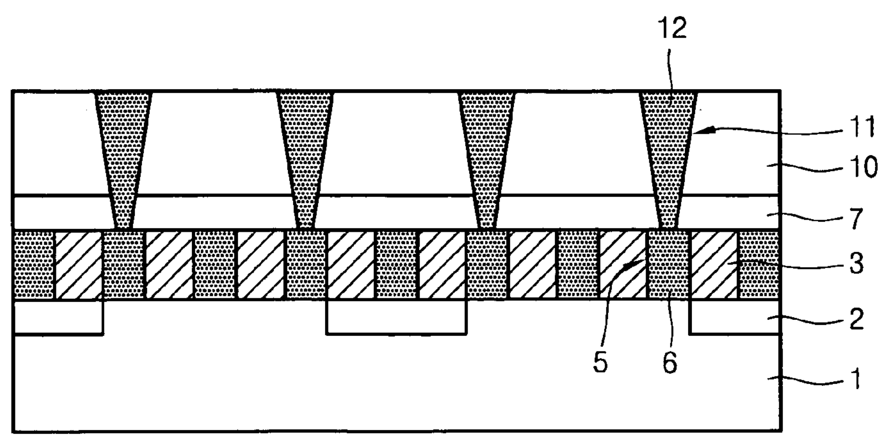
Figure 3H:
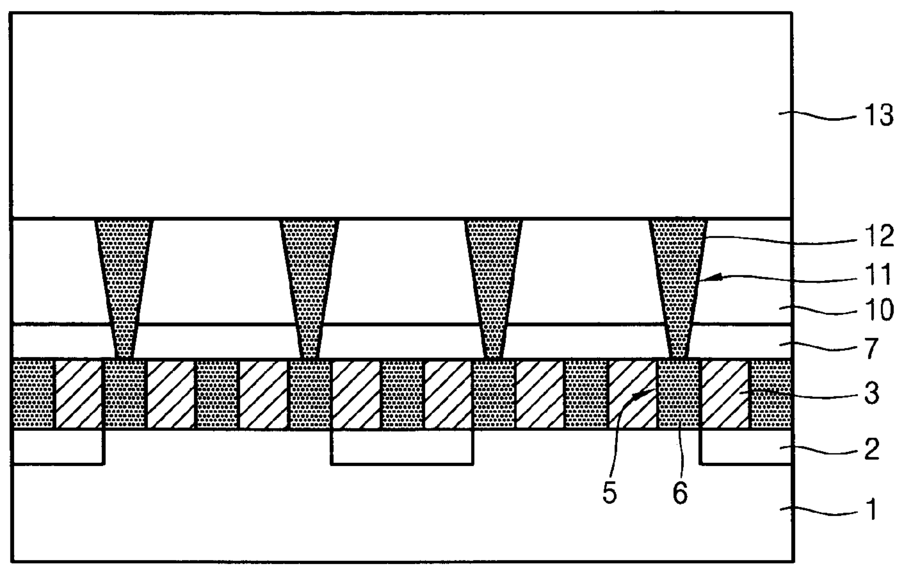
Figure 3I:
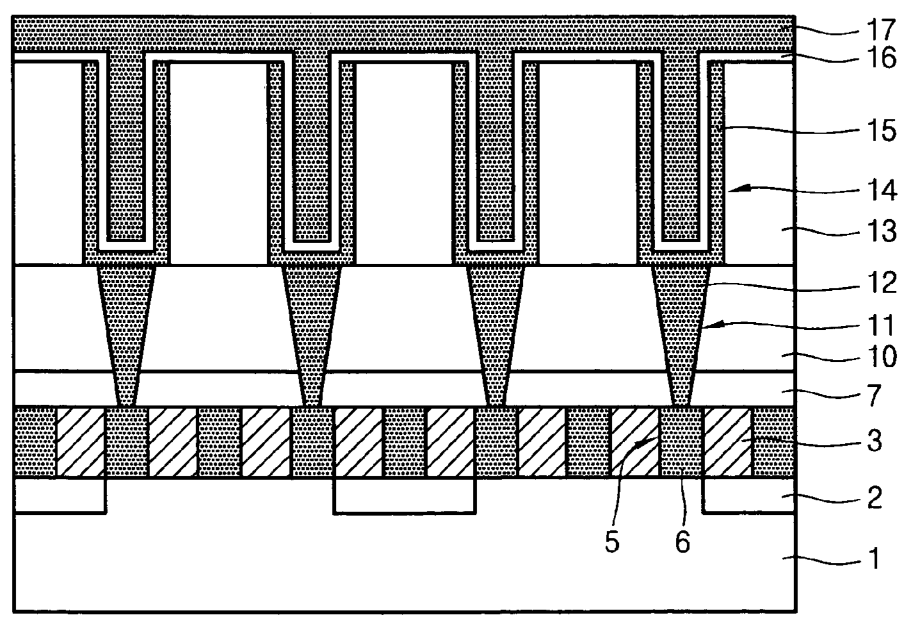
Figure 4A:
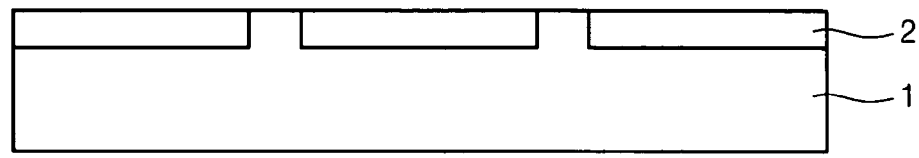
FIGS. 4*a* to 4*e* are sectional views taken along a C-D line shown in FIGS. 1 and 2.
Figure 4B:
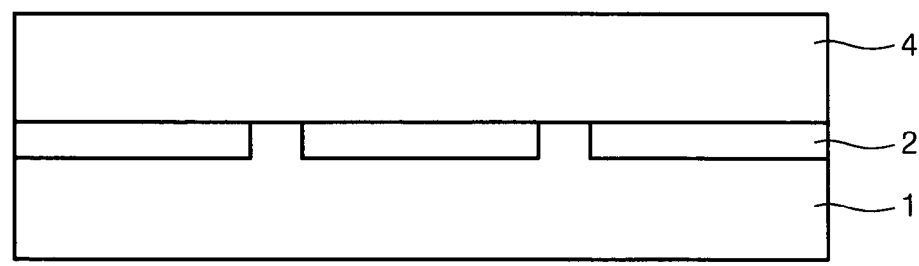
Figure 4C:
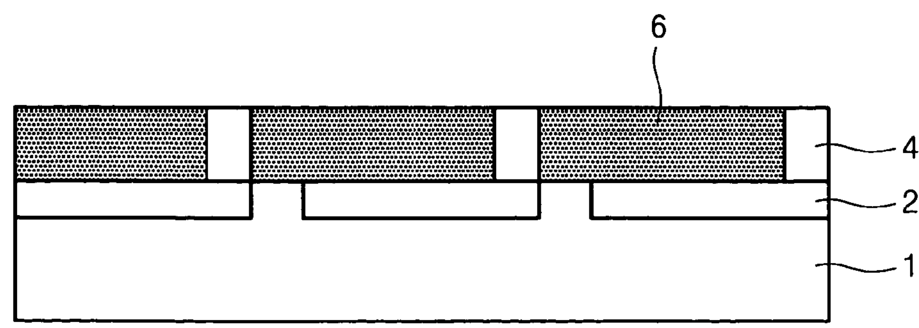
Figure 4D:
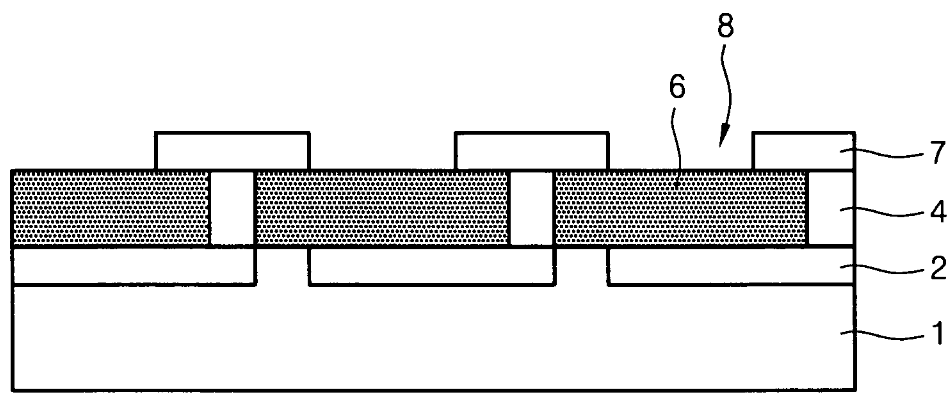
Figure 4E:
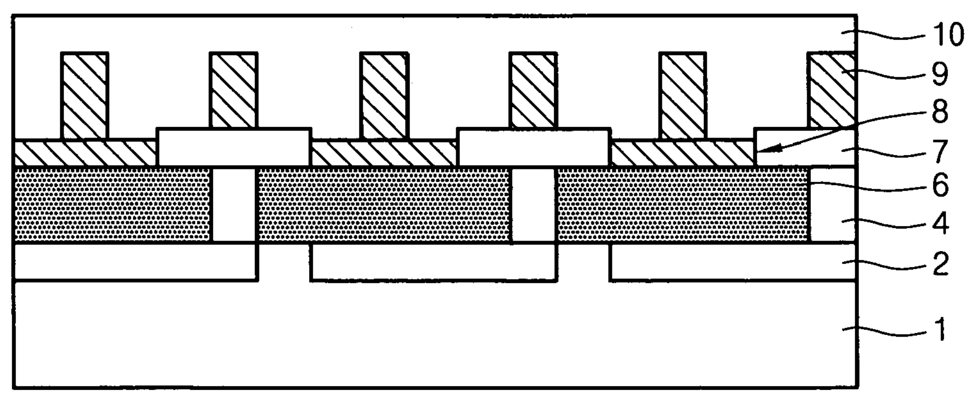
Figure 5A:
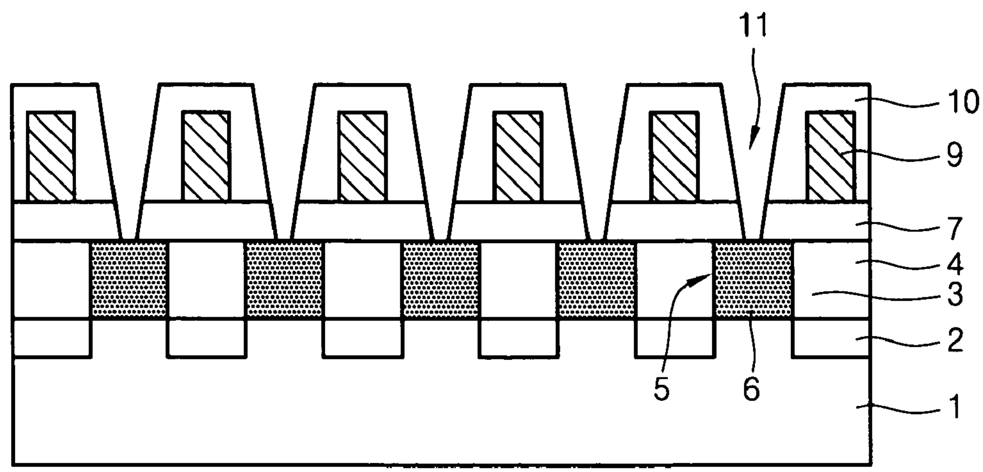
FIGS. 5*a* to 5*d* are sectional views taken along an E-F line shown in FIGS. 1 and 2.
Figure 5B:
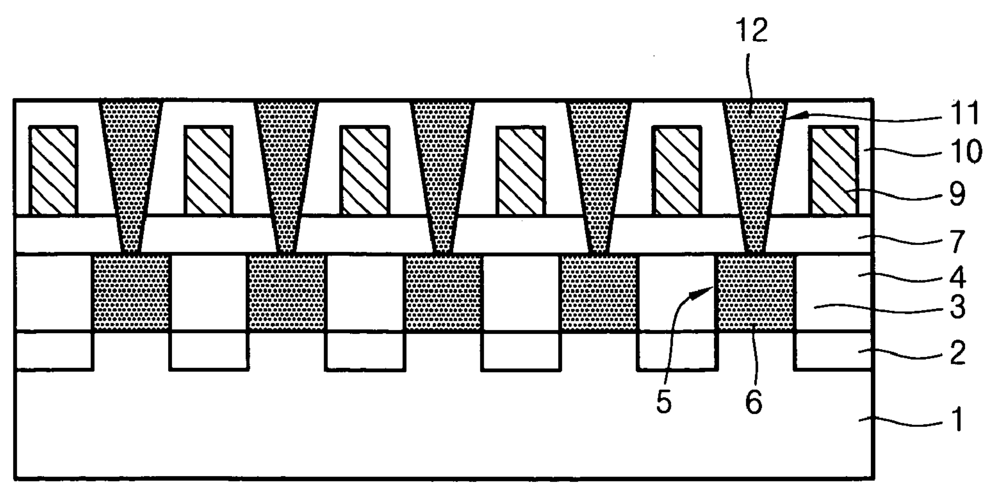
Figure 5C:
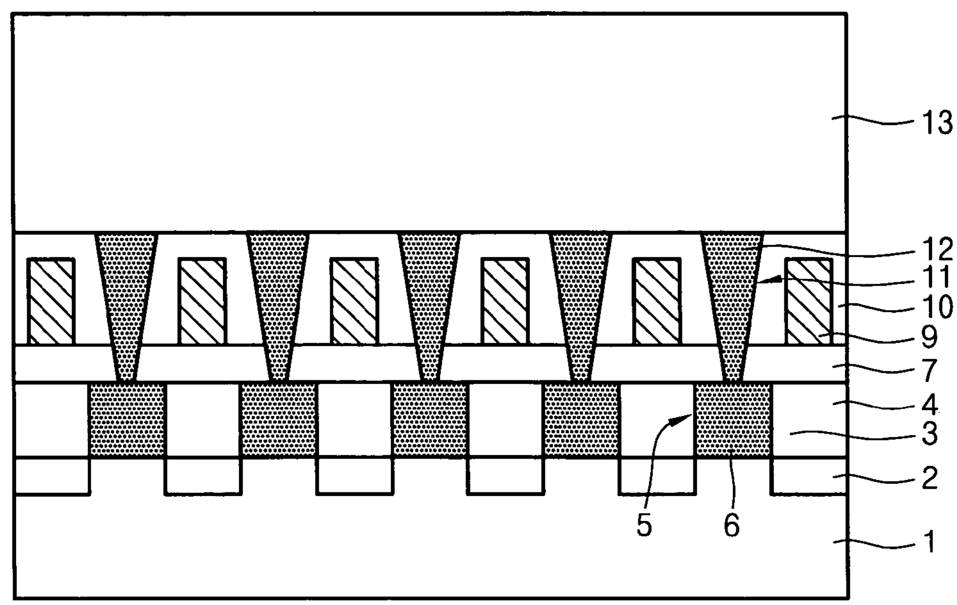
Figure 5D:
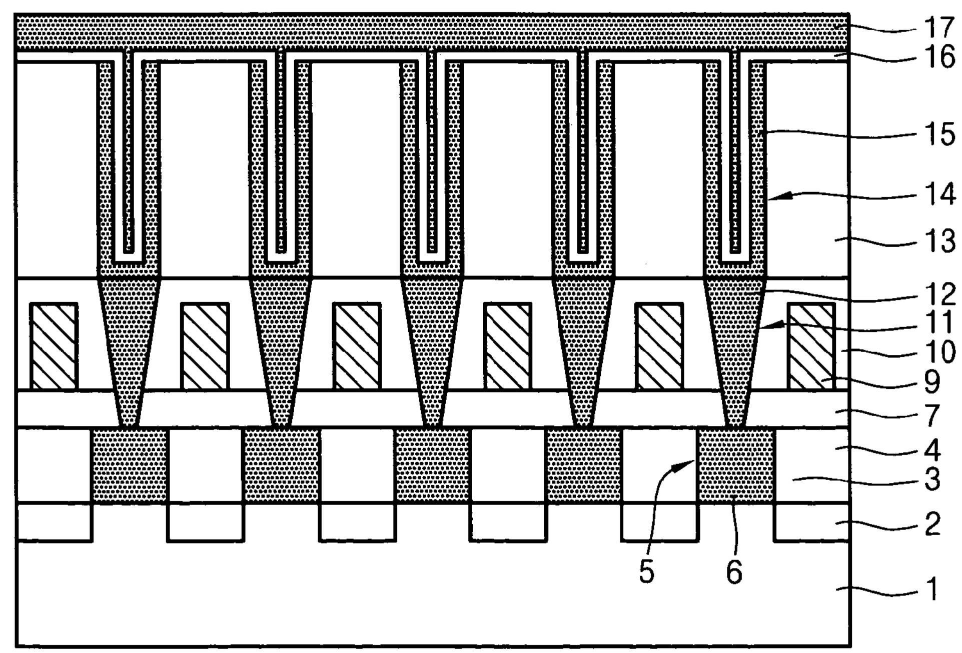

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 6:
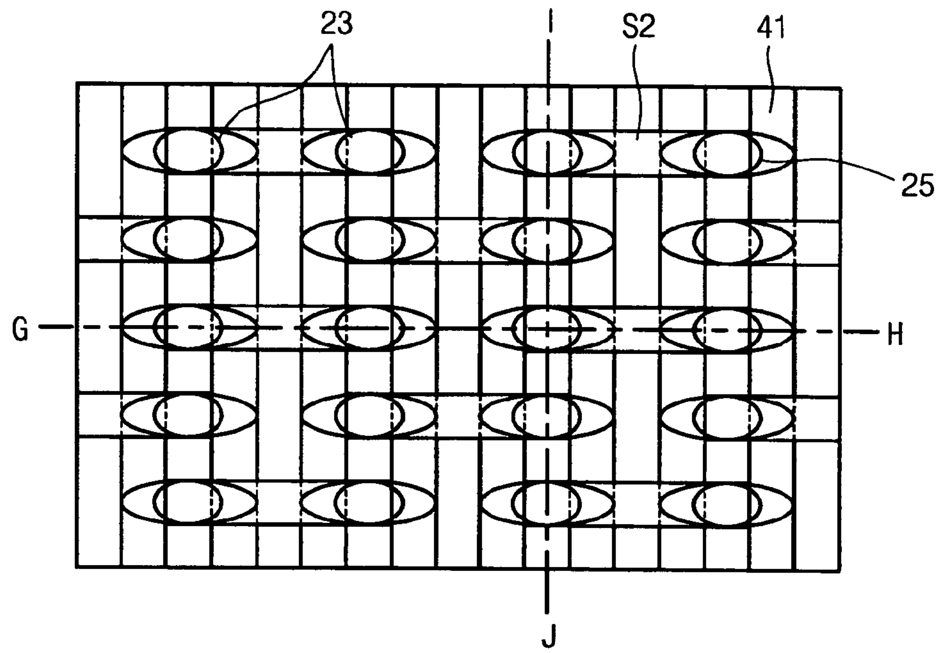
FIGS. 6 and 7 show layout views for explaining a method for manufacturing a semiconductor device according to a first embodiment of the present invention.
Figure 7:
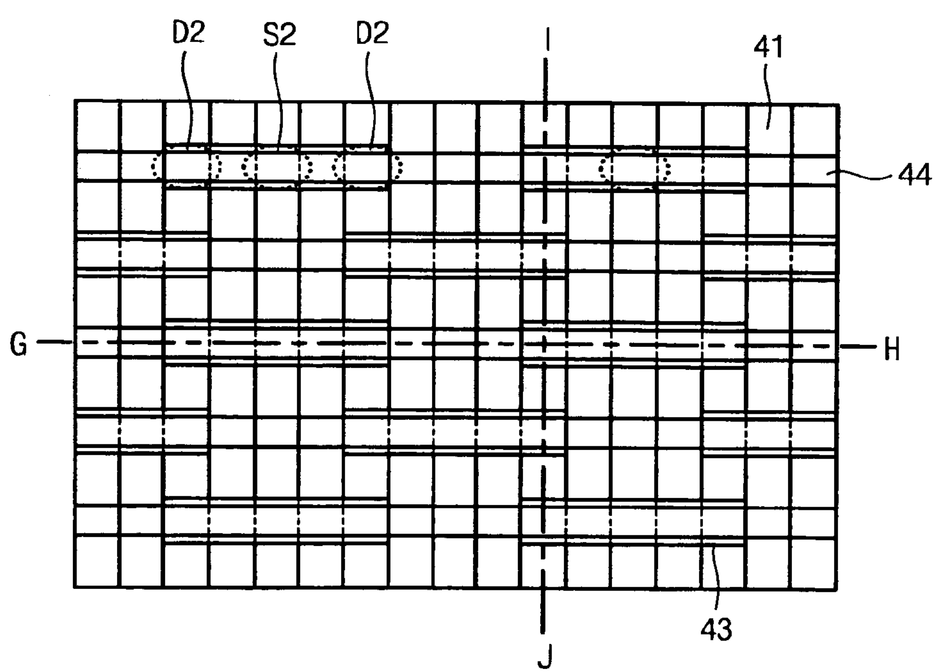

FIGS. 6 and 7 show layout views for explaining a method for manufacturing a semiconductor device according to a first embodiment of the present invention. FIG. 6 shows a layout view of a semiconductor device, for which a capacitor forming process has been carried out. Also, FIG. 7 shows a layout of a semiconductor device, for which a gate line forming process and a bit line forming process have been carried out.

Also, FIGS. 8*a* to 8*h* are sectional views taken along a G-H line shown in FIGS. 6 and 7, and FIGS. 9*a* to 9*h* are sectional views taken along an I-J line shown in FIGS. 6 and 7.

Figure 8A:
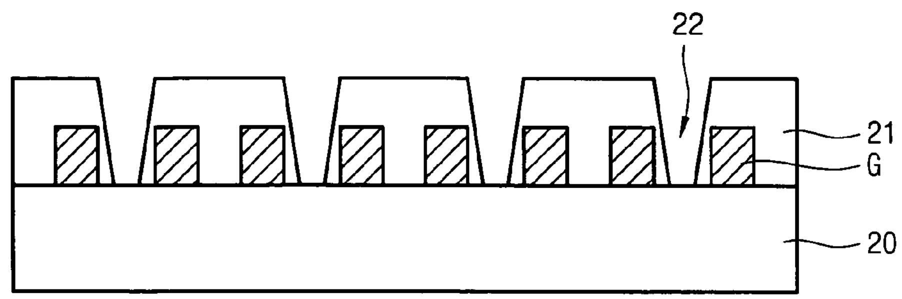
FIGS. 8*a* to 8*h* are sectional views taken along a G-H line shown in FIGS. 6 and 7.
Figure 9A:
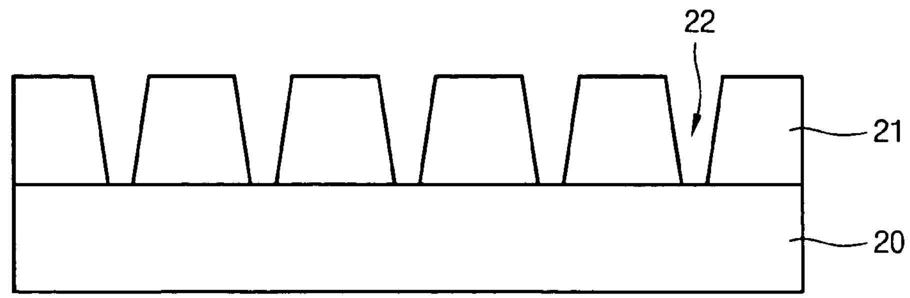
FIGS. 9*a* to 9*h* are sectional views taken along an I-J line shown in FIGS. 6 and 7.

A method for manufacturing a semiconductor device according to the first embodiment of the present invention includes a step of forming a gate line (G) on a first surface of a first substrate 20 including silicon as shown in FIGS. 6, 8*a*, and 9*a*. Also, after forming a first insulating layer 21 on an entire surface of the substrate 20 including the gate line (G), the first insulating layer is selectively etched, thereby forming a storage node contact 22.

Figure 8B:
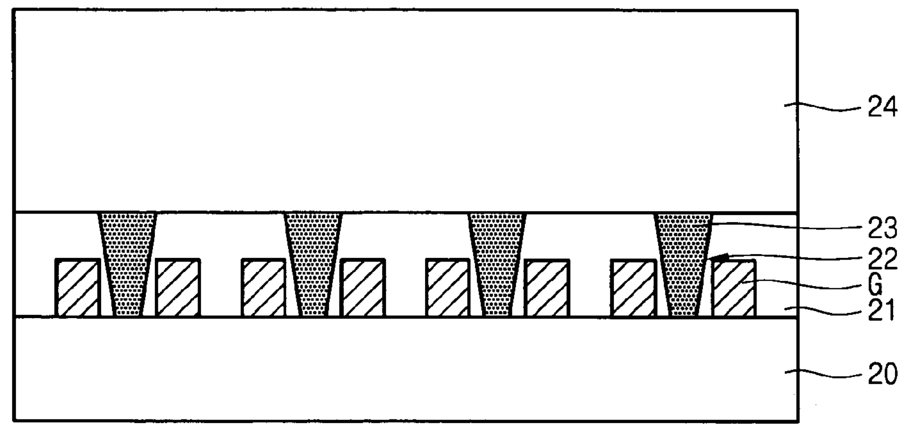
Figure 9B:
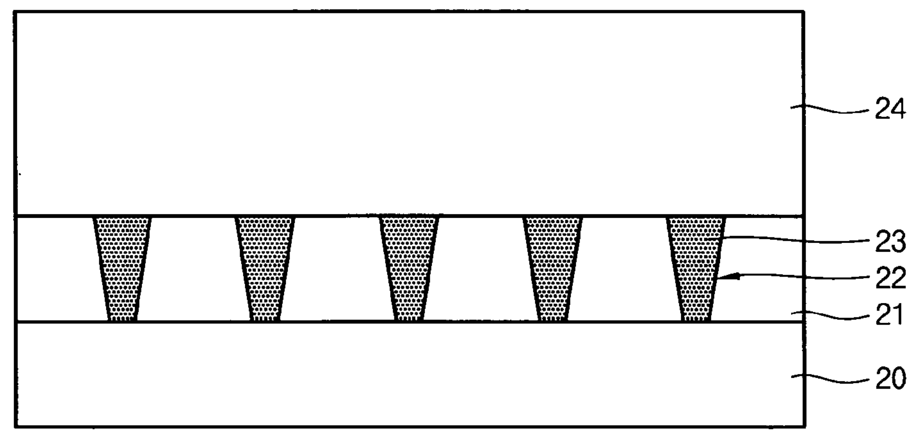

Then, as shown in FIGS. 8*b* and 9*b*, after forming a conductive plug 23 filling the storage node contact 22, a second insulating layer 24 is formed on an entire surface of the resultant structure.

Figure 8C:
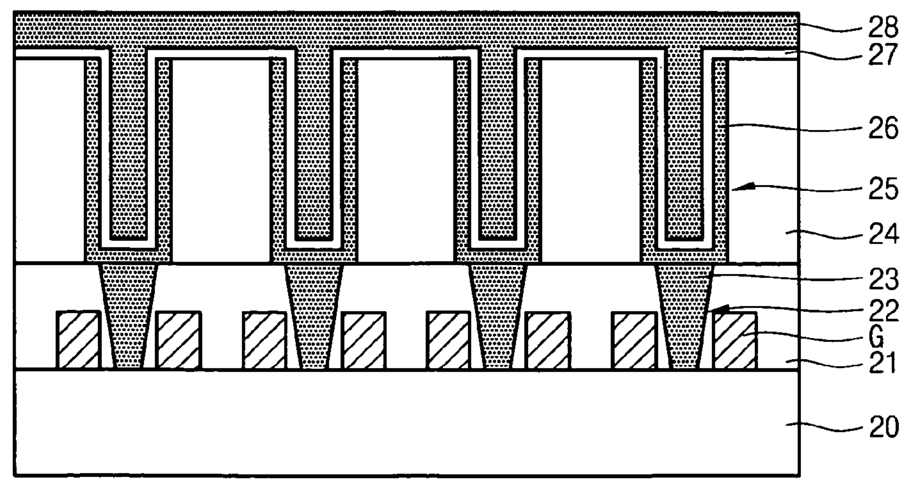
Figure 9C:
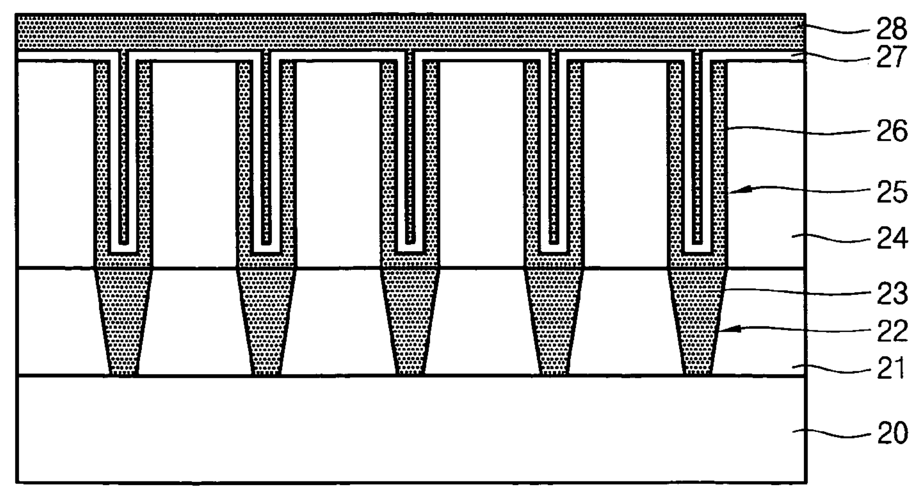

After that, as shown in FIGS. 8*c* and 9*c*, after forming a contact hole 25 for exposing the conductive plug 23 by selectively etching the second insulating layer, a storage node electrode 26 of a capacitor is formed in such a manner that the storage node electrode 26 is connected to the conductive plug 23 while covering an inner wall of the contact hole 25. Subsequently, a dielectric layer 27 and a plate electrode 28 are sequentially formed on the storage node electrode 26 of the capacitor, thereby fabricating the capacitor.

Figure 8D:
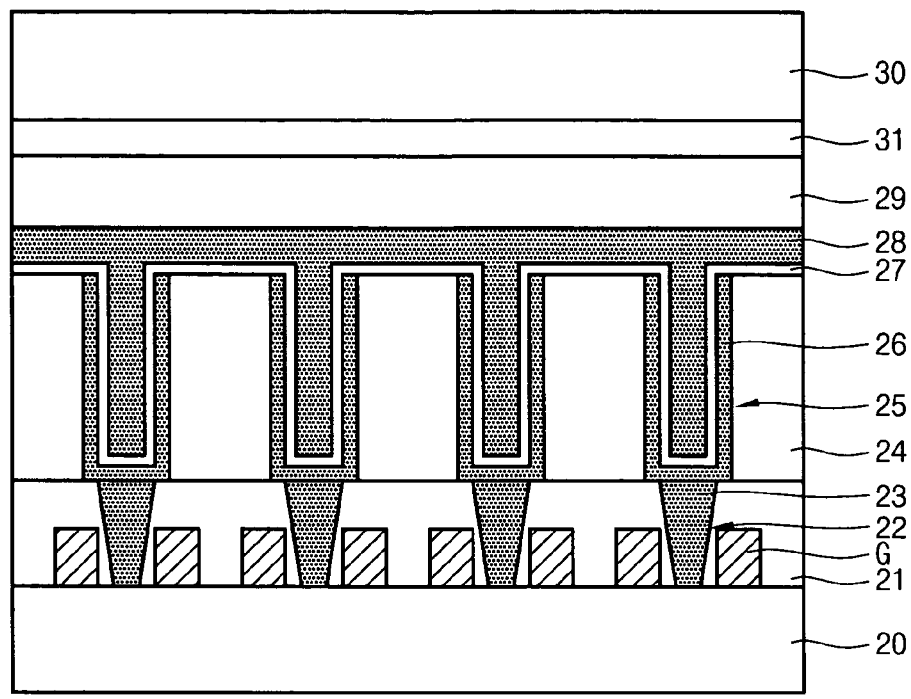
Figure 9D:
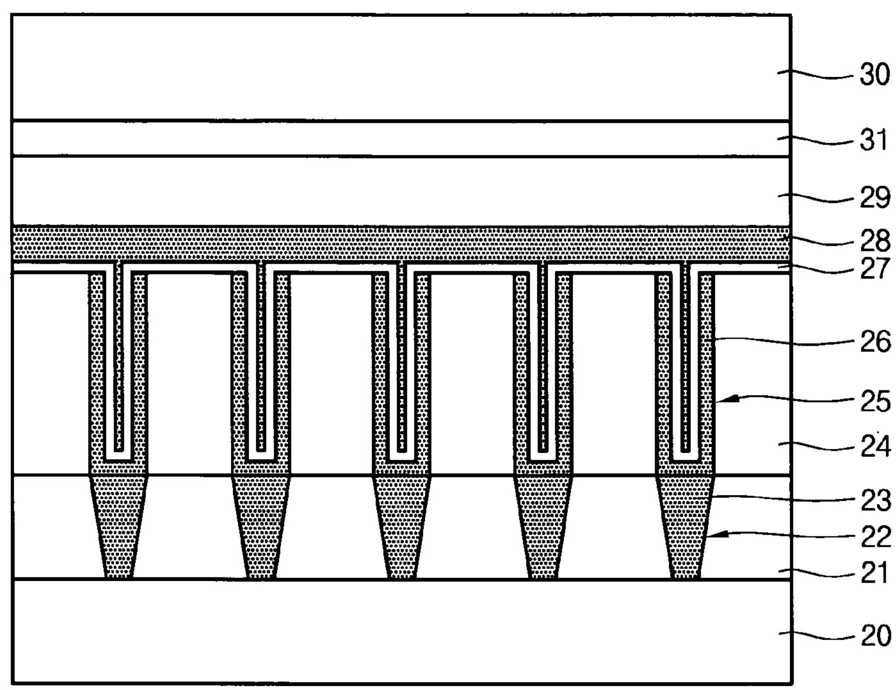

Then, as shown in FIGS. 8*d* and 9*d*, a third insulating layer 29 is formed on a structure of the plate electrode 28 of the capacitor.

After that, a second substrate 30 formed with the first insulating layer 31 is provided. Herein, the second substrate 30 may be any one selected from the group consisting of a silicon substrate, a glass substrate, and a plastic substrate. Subsequently, the first insulating layer 31 of the second substrate 30 is bonded to the third insulating layer 29 of the first substrate.

Figure 8E:
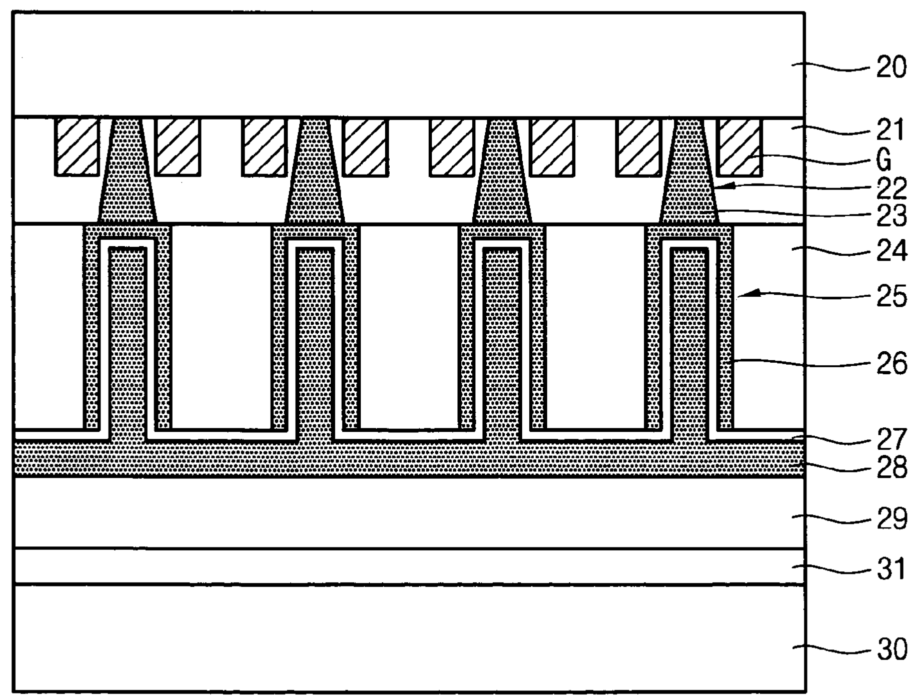
Figure 9E:
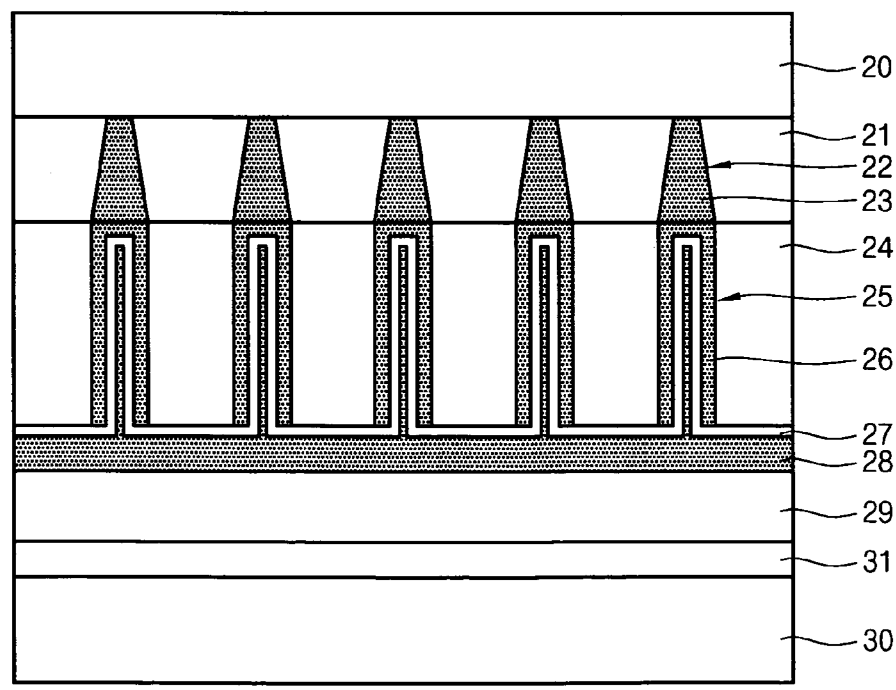

Then, as shown in FIGS. 8*e* and 9*e*, the bonded first and second substrates are turned over in such a manner that a second surface of the first substrate, which is opposite to the first surface on which the capacitor is formed, becomes an upper surface of the bonded first and second substrates.

Figure 8F:
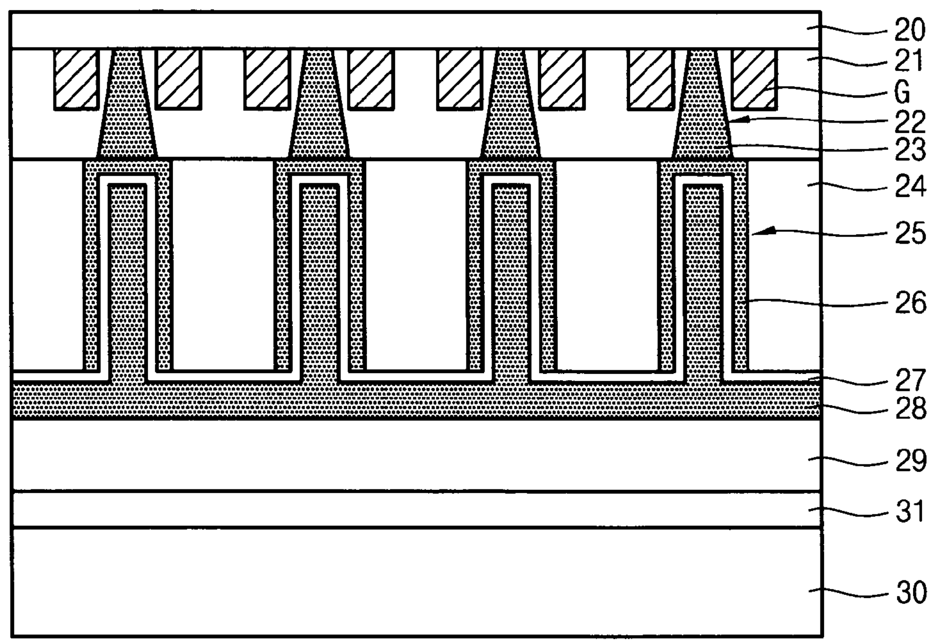
Figure 9F:
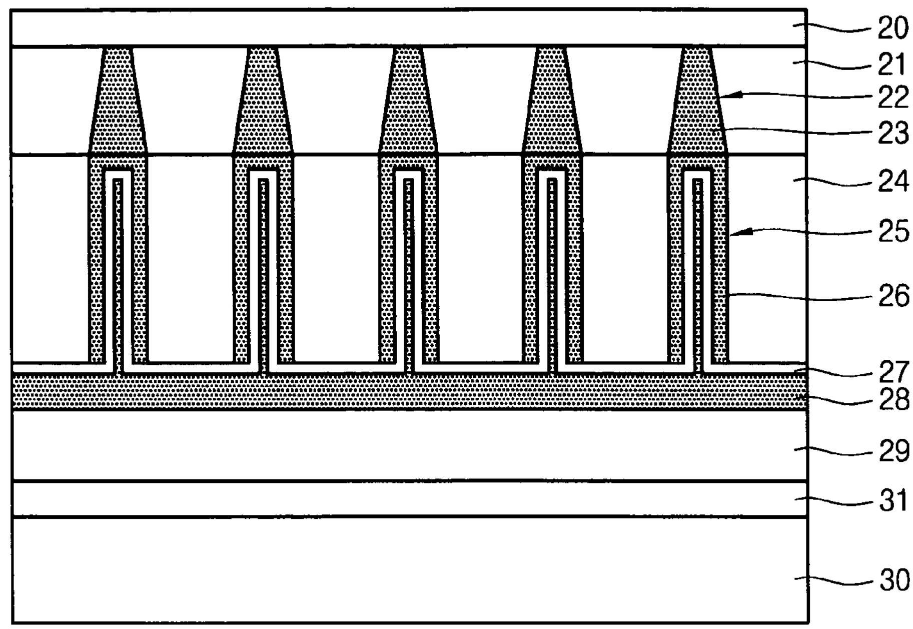

After that, as shown in FIGS. 8*f* and 9*f*, the second surface of the first substrate is etched by a predetermined thickness.

Figure 8G:
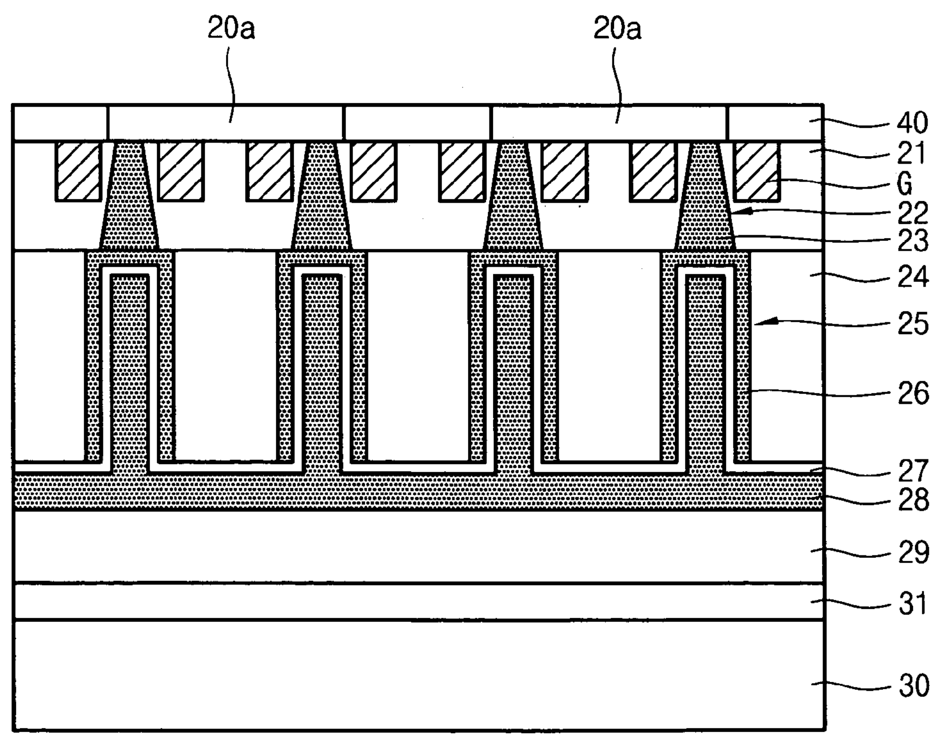
Figure 9G:
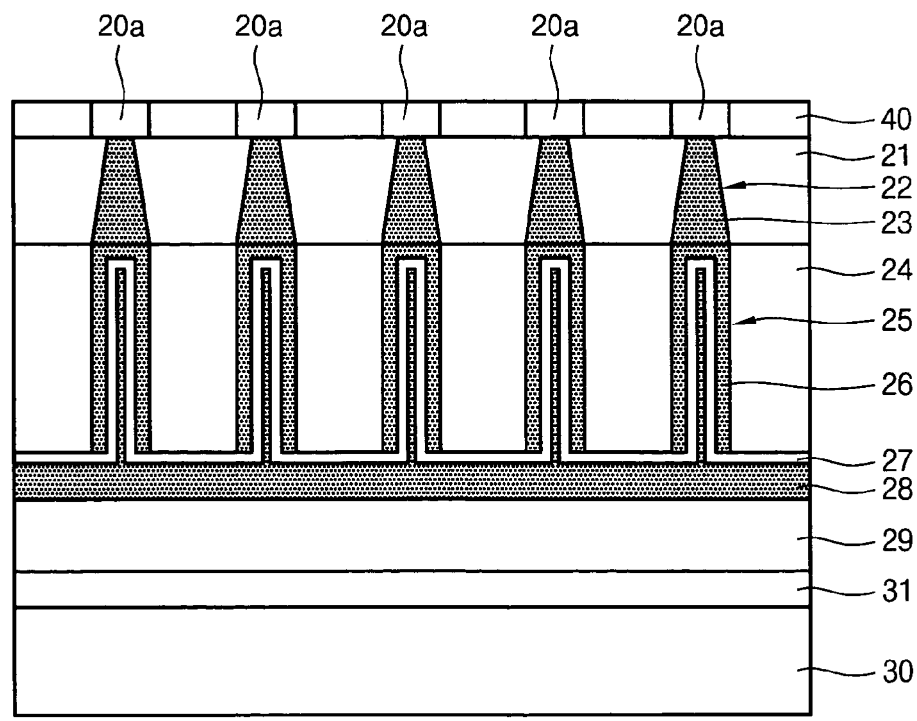

Subsequently, as shown in FIGS. 7, 8*g*, and 9*g*, an isolation process is performed with respect to the second surface of the first substrate, which has been etched, so as to form an isolation layer 40. Reference numeral 20*a* represents an active region, which is a part marked with S2/D2 in FIG. 7.

Figure 8H:
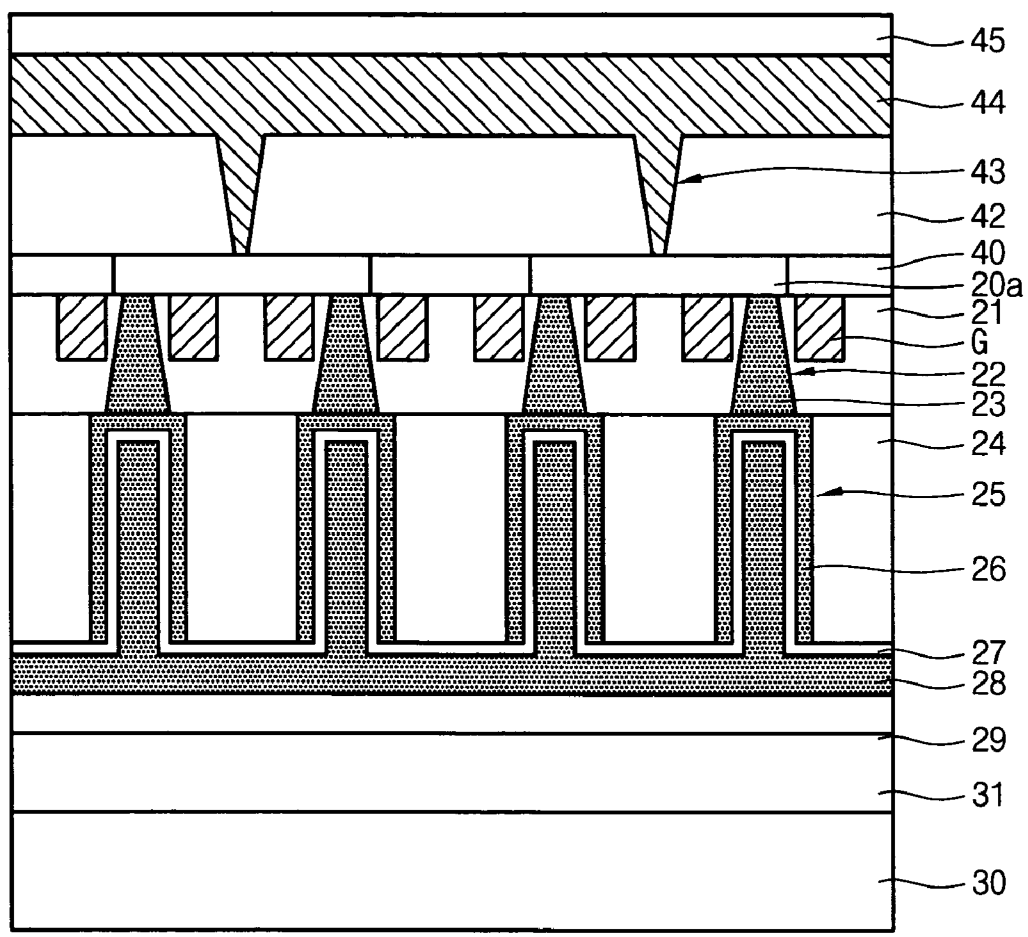
Figure 9H:
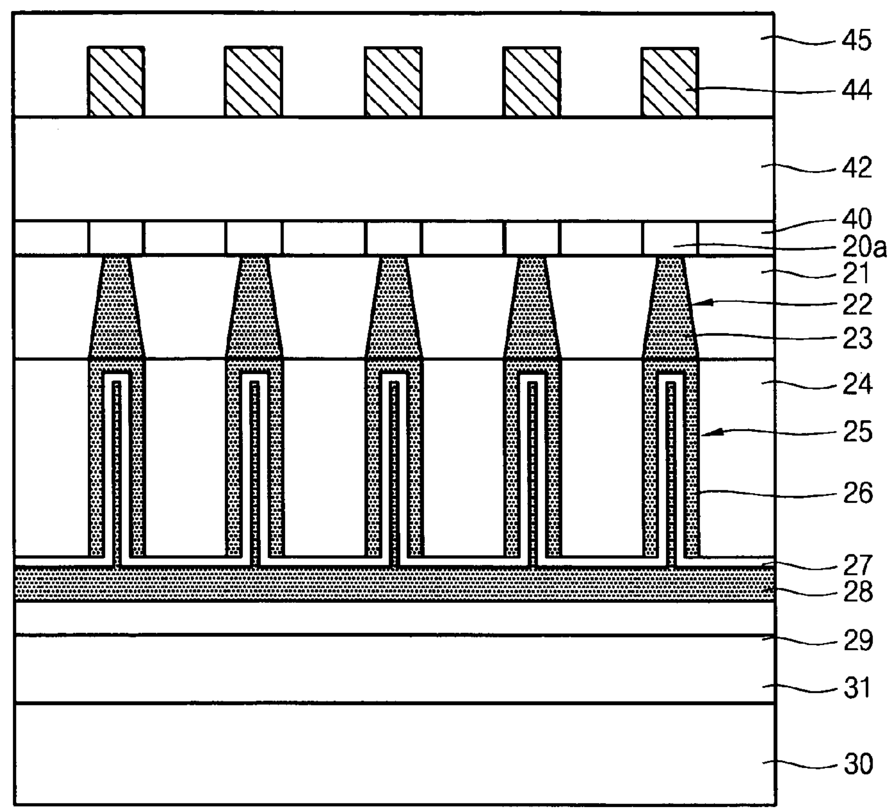

Then, as shown in FIGS. 8*h* and 9*h*, a fourth insulating layer 42 is formed on the substrate including the isolation layer 40 and the active region 20*a*.

After that, the fourth insulating layer is selectively etched so as to form a bit line contact 43 for exposing the active region 20*a*, and a bit line 44 filling the bit line contact 43 is formed. Subsequently, a fifth insulating layer 45 is formed such that the fifth insulating layer 45 covers the bit line.

Figure 10:
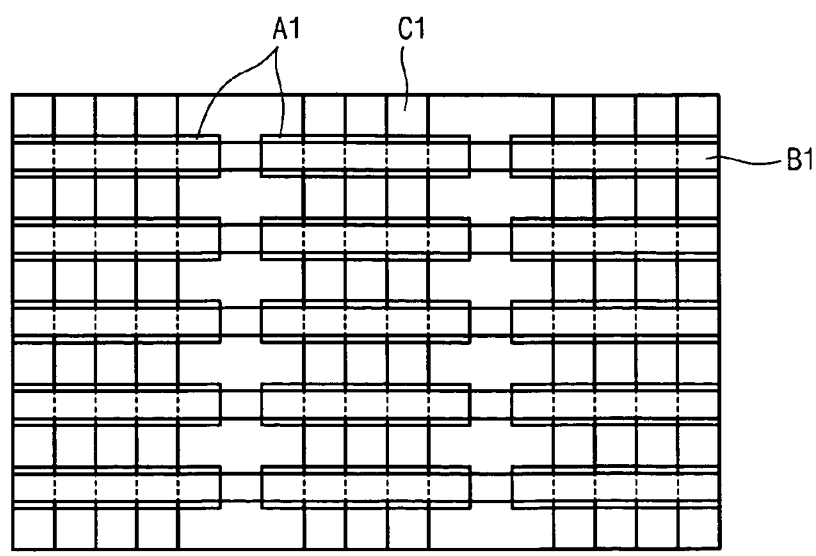
FIG. 10 is a plan view showing active regions uniformly aligned in match with rows and columns.

FIG. 10 is a plan view showing active regions uniformly aligned in match with rows and columns.

As shown in FIG. 10, according to the first embodiment of the present invention, active regions (A1) are uniformly aligned in match with rows and columns, so that it is possible fabricate a cell with a compact size as compared with a cell fabricated through a conventional method in which active regions are offset from each other regardless of rows and columns. Reference numerals B1 and C1 represent a bit line and a gate line, respectively.

According to the first embodiment of the present invention, after bonding the second substrate to the first surface of the first substrate having the gate line and the capacitor, the isolation process is carried out with respect to the second surface of the first substrate. After that, the bit line is formed. Therefore, it is unnecessary to perform a process for forming an additional landing plug, which is connected to the source region in order to form the bit line. In addition, the bit line contact forming process can be achieved at a time without considering a cell area and a peripheral circuit area.

Figure 11:
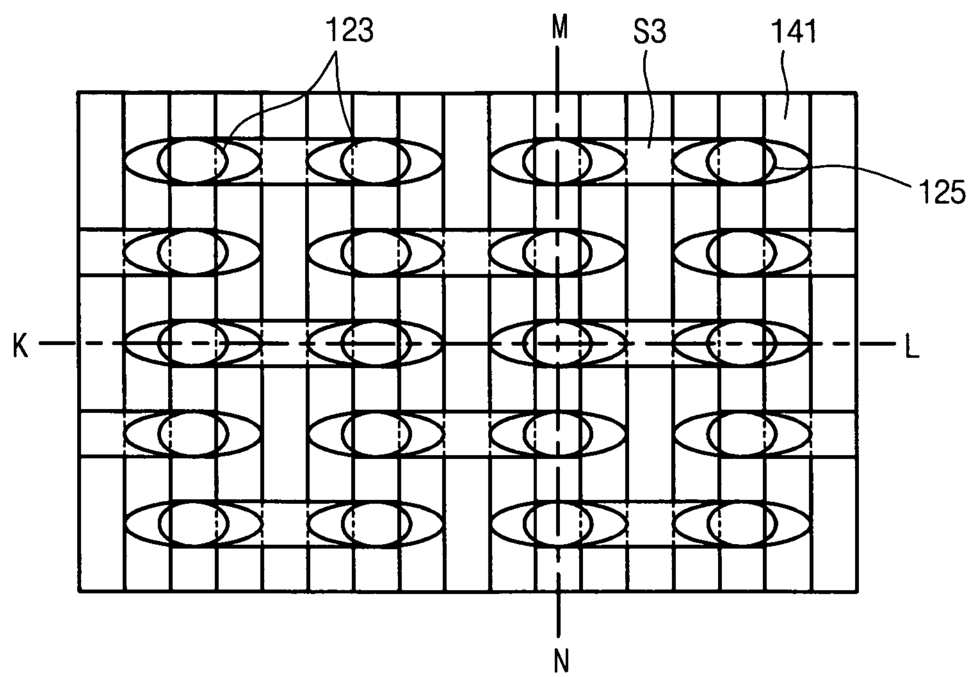
FIGS. 11 and 12 show layout views of a semiconductor device according to a second embodiment of the present invention.
Figure 12:
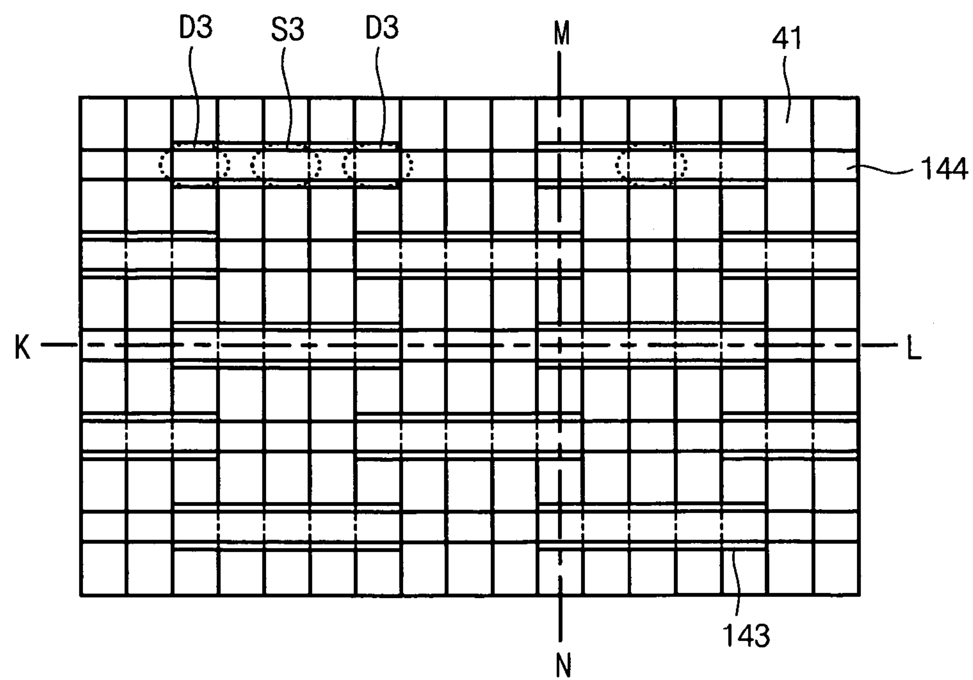

FIGS. 11 and 12 show layout views of a semiconductor device for explaining a method for manufacturing the semiconductor device according to the second embodiment of the present invention. FIG. 11 shows a layout view of a semiconductor device for which a capacitor forming process has been carried out. FIG. 12 shows a layout view of a semiconductor device for which a gate line forming process and a bit line forming process have been carried out.

Also, FIGS. 13*a* to 13*i* are sectional views taken along a K-L line shown in FIGS. 11 and 12. FIGS. 14*a* to 14*i* are sectional views taken along an M-N line shown in FIGS. 11 and 12.

Figure 13A:
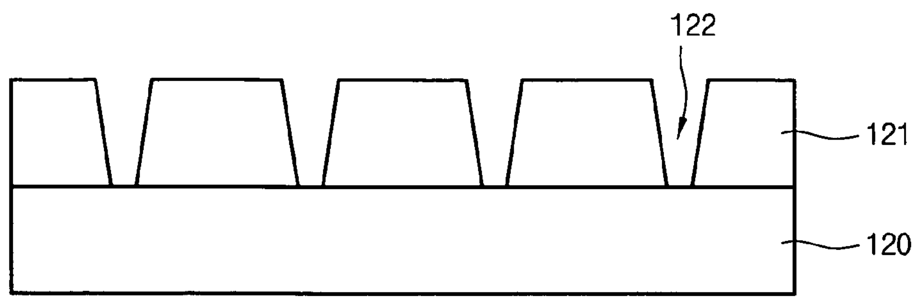
FIGS. 13*a* to 13*i* are sectional views taken along a K-L line shown in FIGS. 11 and 12.
Figure 14A:
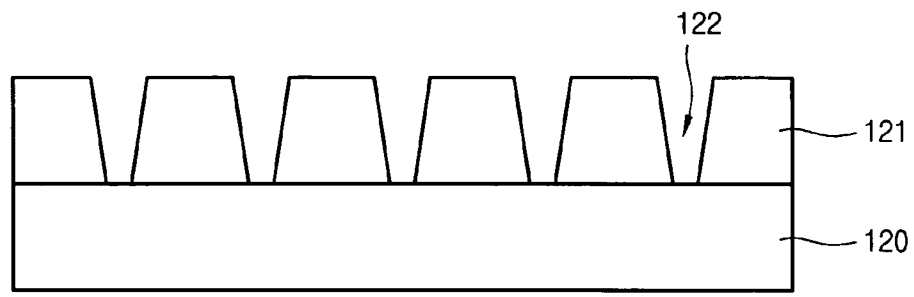
FIGS. 14*a* to 14*i* are sectional views taken along an M-N line shown in FIGS. 11 and 12.

In a method for manufacturing a semiconductor device according to the second embodiment of the present invention, as shown in FIGS. 11, 13*a*, and 14*a*, after forming a first insulating layer 121 on a first surface of a first substrate 120 including silicon, the first insulating layer 121 is selectively etched, thereby forming a storage node contact 122.

Figure 13B:
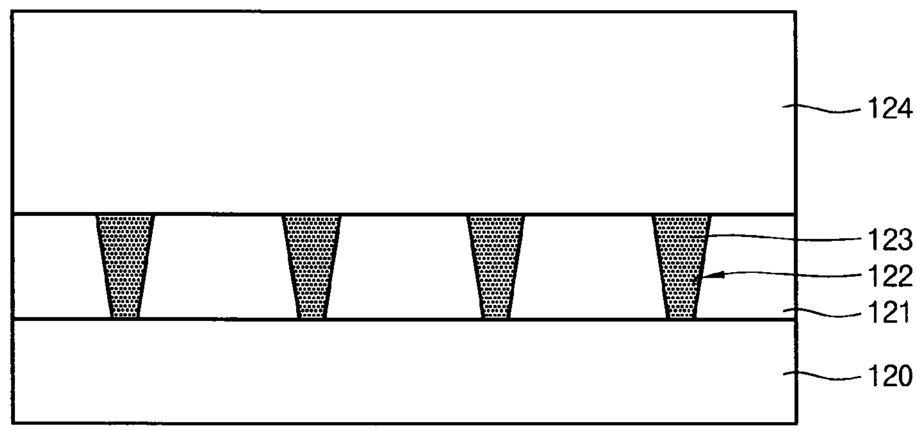
Figure 14B:
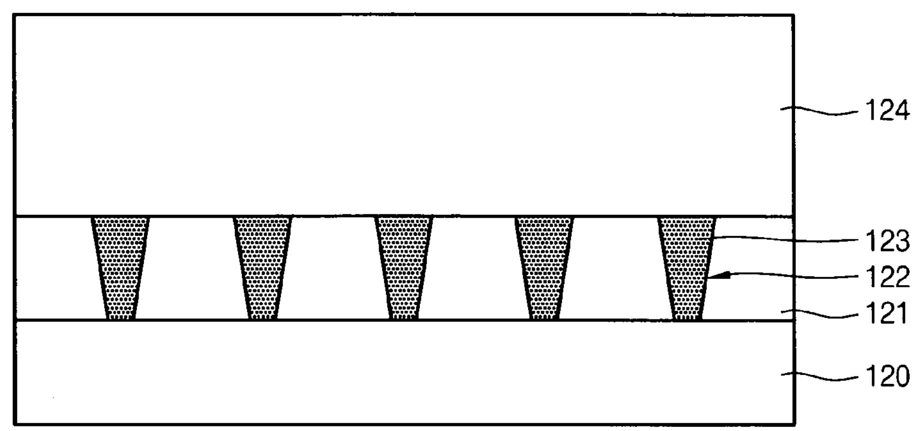

Then, as shown in FIGS. 13*b* and 14*b*, after forming a conductive plug 123 filling the storage node contact 122, a second insulating layer 124 is formed on an entire surface of the resultant structure.

Figure 13C:
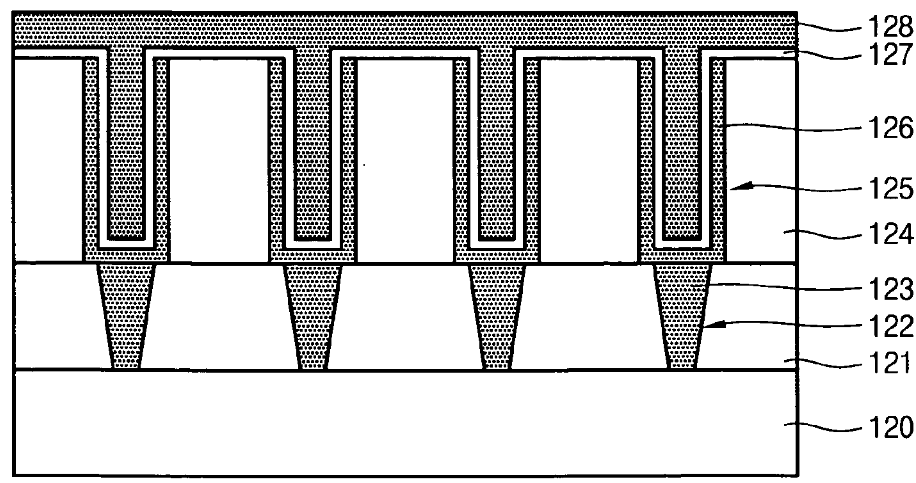
Figure 14C:
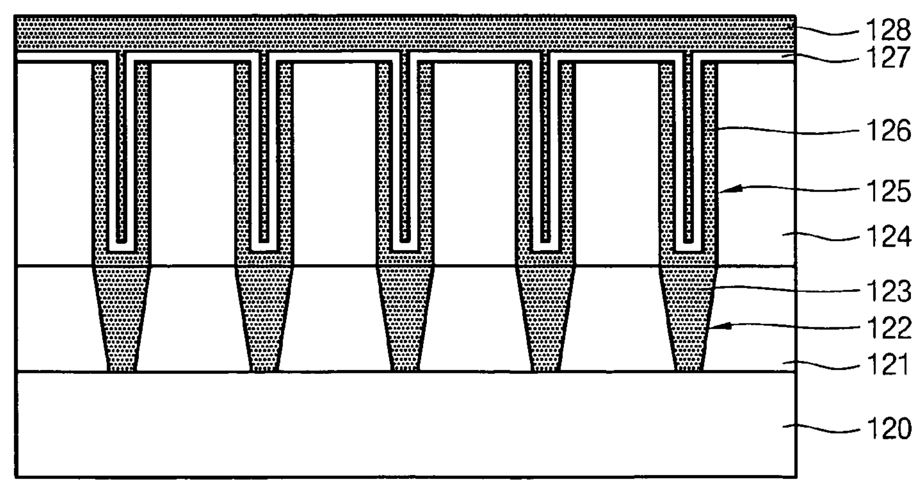

After that, as shown in FIGS. 13*c* and 14*c*, after forming a contact hole 125 for exposing the conductive plug 123 by selectively etching the second insulating layer, a storage node electrode 126 of a capacitor is formed such that the storage node electrode 126 is connected to the conductive plug 123 while covering the inner wall of the contact hole 125. Subsequently, a dielectric layer 127 and a plate electrode 128 are sequentially formed on the storage node electrode 126 of the capacitor.

Figure 13D:
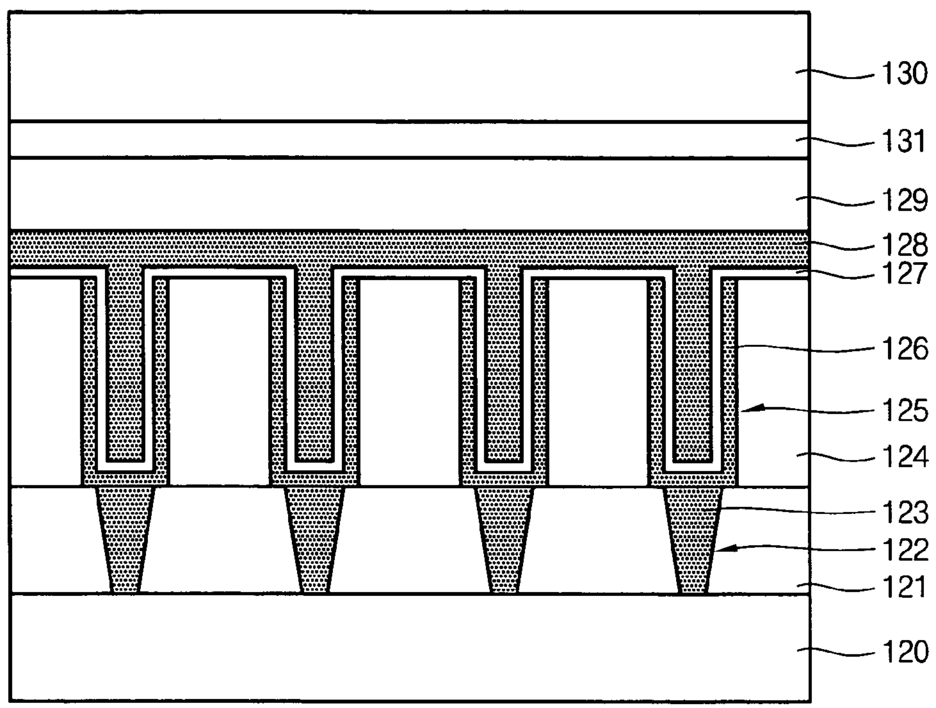
Figure 14D:
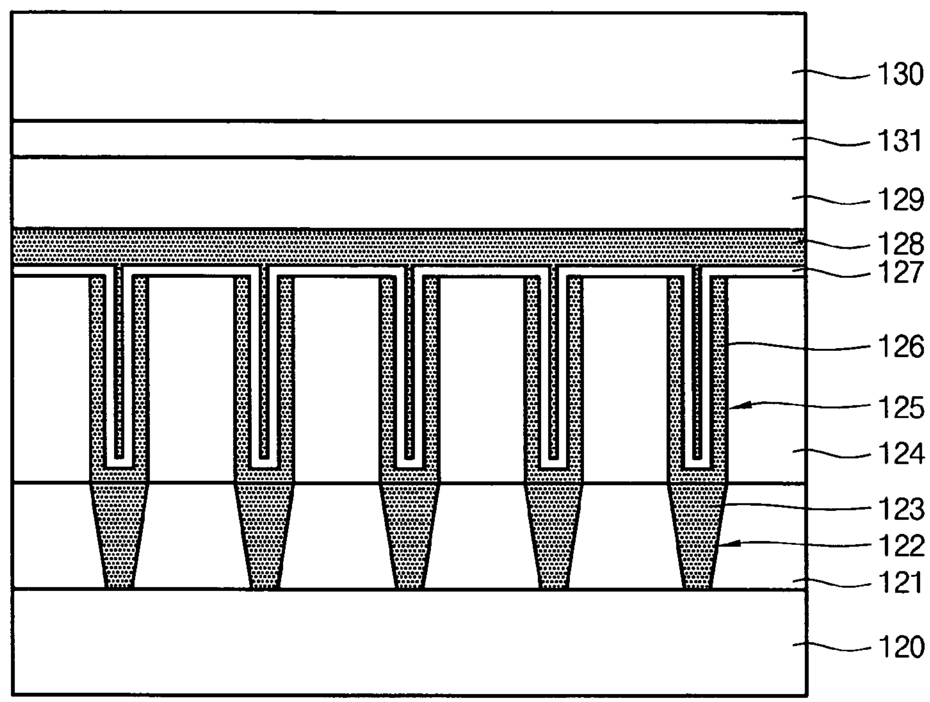

Then, as shown in FIGS. 13*d* and 14*d*, a third insulating layer 129 is formed on a structure of the plate electrode 128.

After that, a second substrate 130 having the first insulating layer 131 is provided. Herein, the second substrate 130 may be any one selected from the group consisting of a silicon substrate, a glass substrate, and a plastic substrate. Subsequently, the second substrate 130 is bonded to the third insulating layer 129 of the first substrate. At this time, the third insulating layer 129 of the first substrate and the first insulating layer 131 of the second substrate are aligned such that the third insulating layer 129 of the first substrate makes contact with the first insulating layer 131 of the second substrate.

Figure 13E:
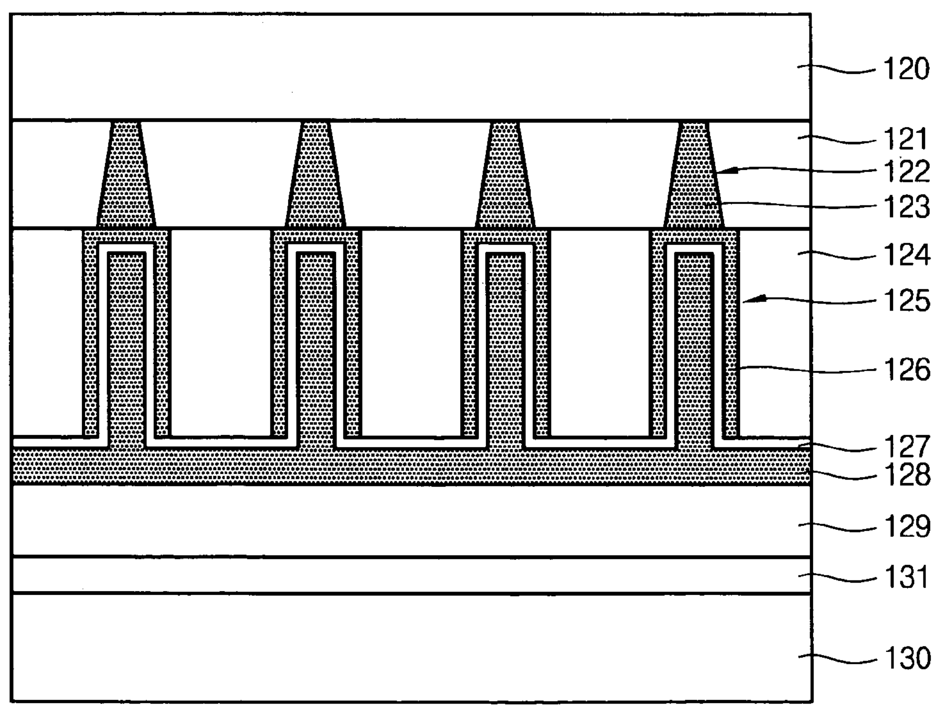
Figure 14E:
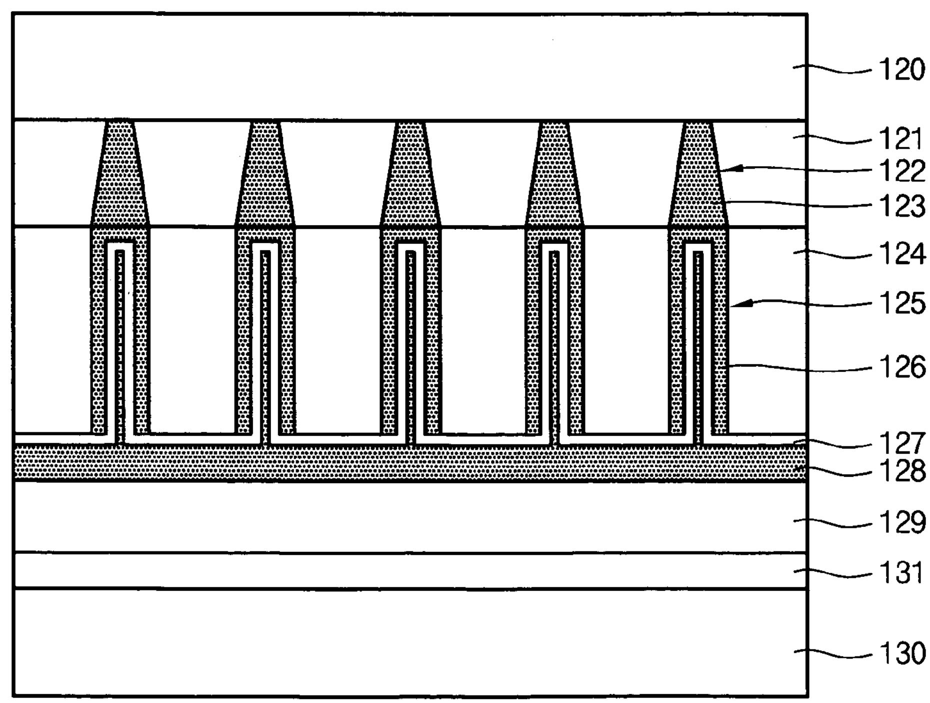

Then, as shown in FIGS. 13*e* and 14*e*, the bonded first and second substrates are turned over in such a manner that the second surface of the first substrate, which is opposite to the first surface having the capacitor, is an upper surface of the bonded first and second substrates.

Figure 13F:
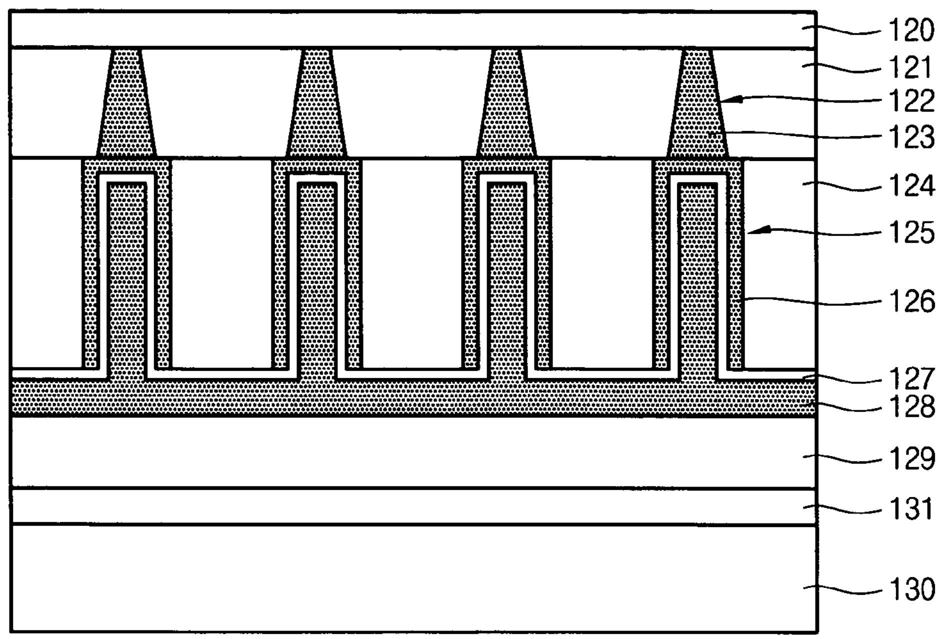
Figure 14F:
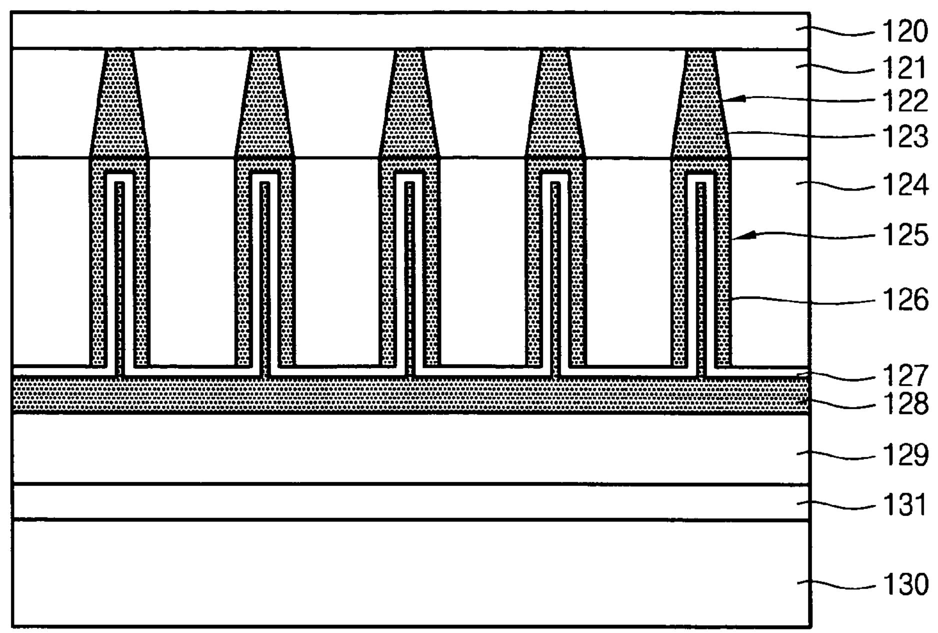

After that, as shown in FIGS. 13*f* and 14*f*, the second surface of the first substrate is etched by a predetermined thickness.

Figure 13G:
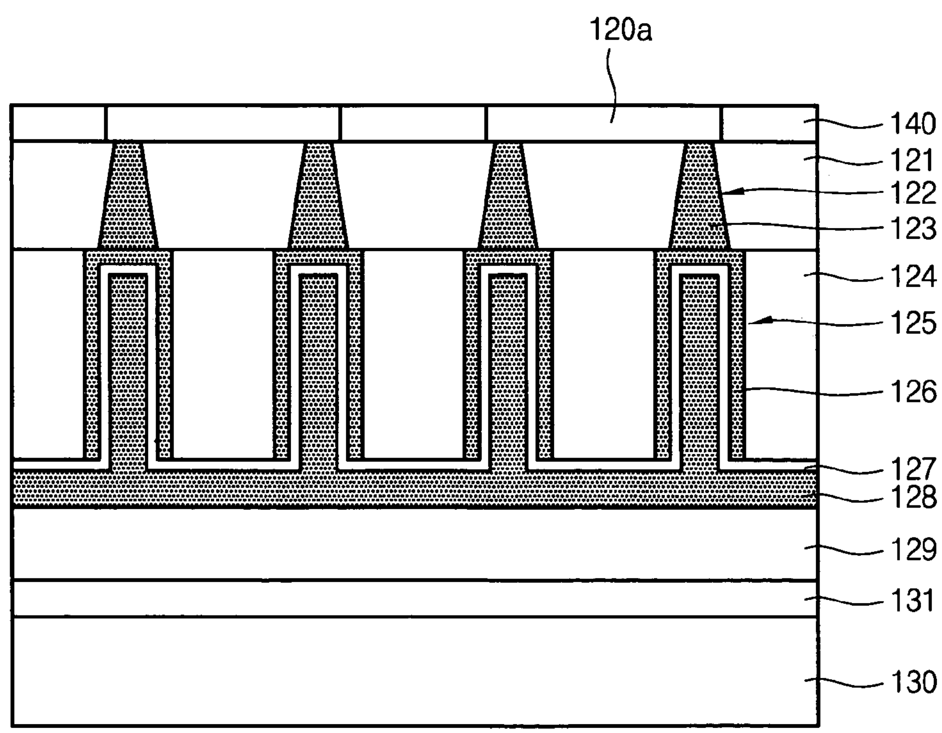
Figure 14G:
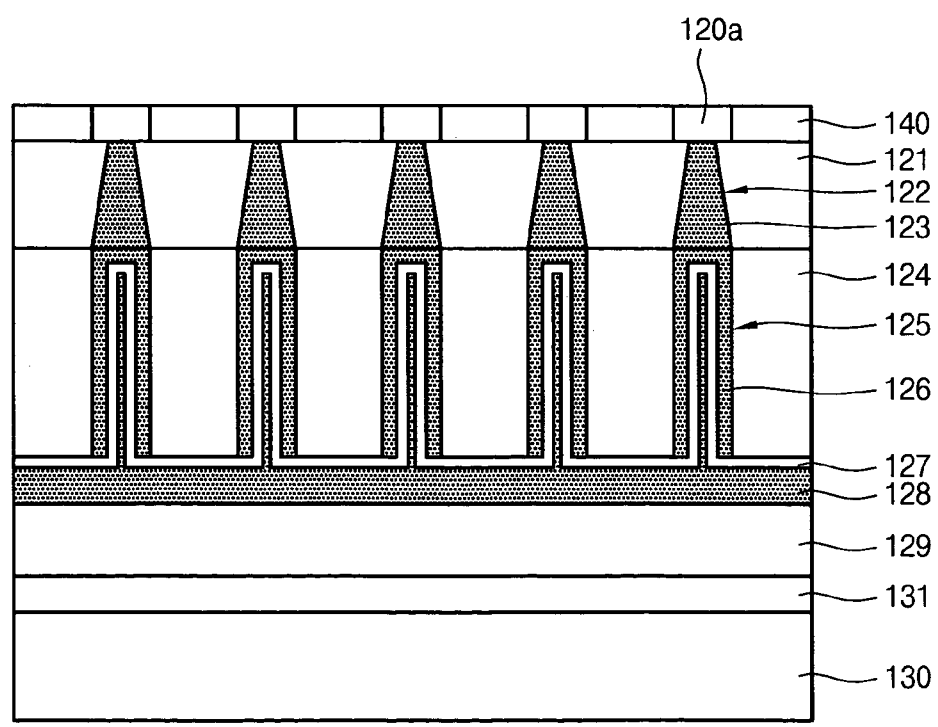

Subsequently, as shown in FIGS. 12, 13*g*, and 14*g*, an isolation process is performed with respect to the second surface of the first substrate, which has been etched, so as to form an isolation layer 140. At this time, a reference numeral 120*a* represents an active region, which is a part marked as S3/DS in FIG. 12.

Figure 13H:
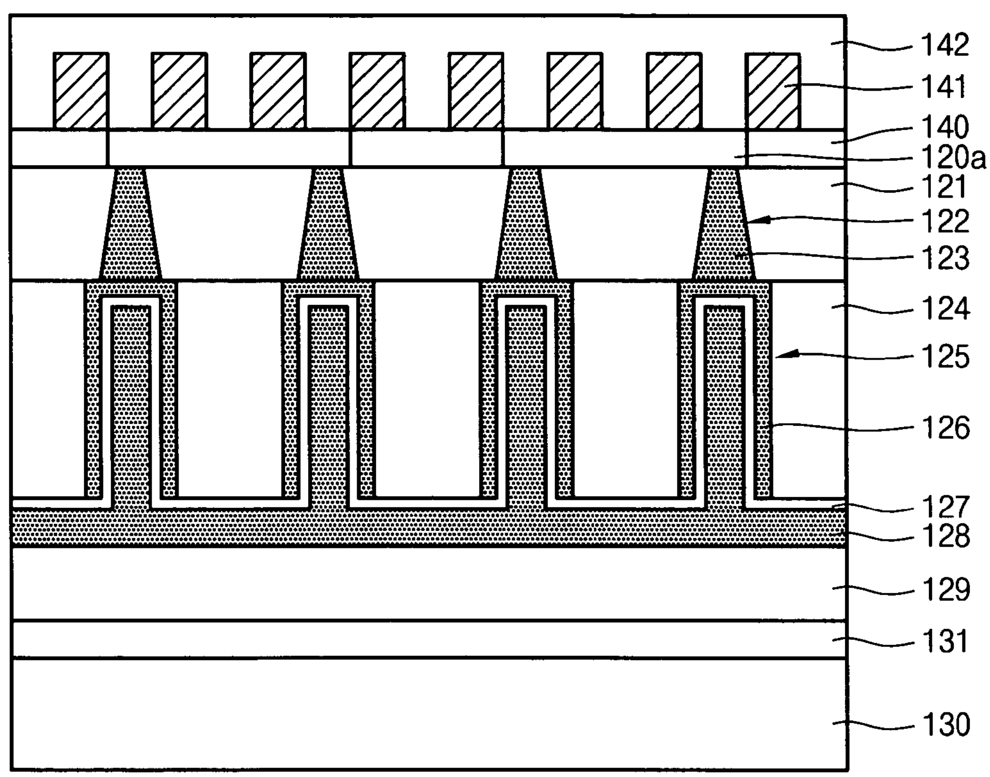
Figure 14H:
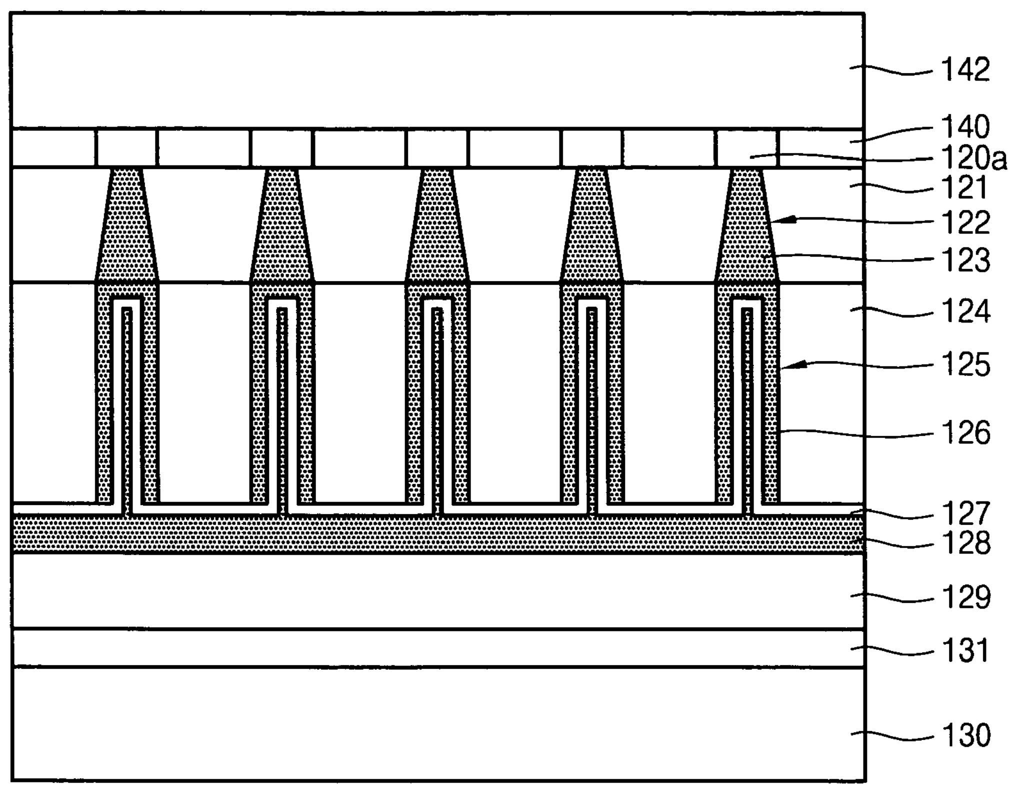

Then, as shown in FIGS. 13*h* and 14*h*, after forming a gate line on the isolation layer 140 and the active region 120*a*, a fourth insulating layer 142 covering the gate line is formed.

Figure 13I:
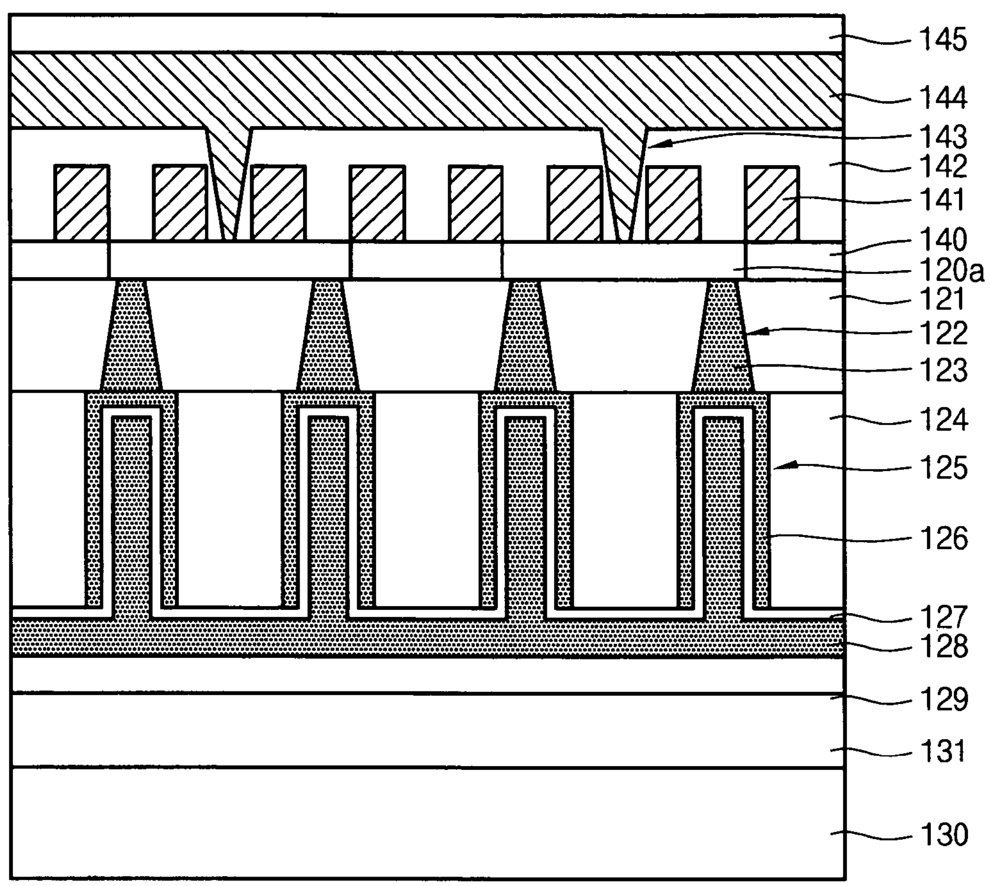
Figure 14I:
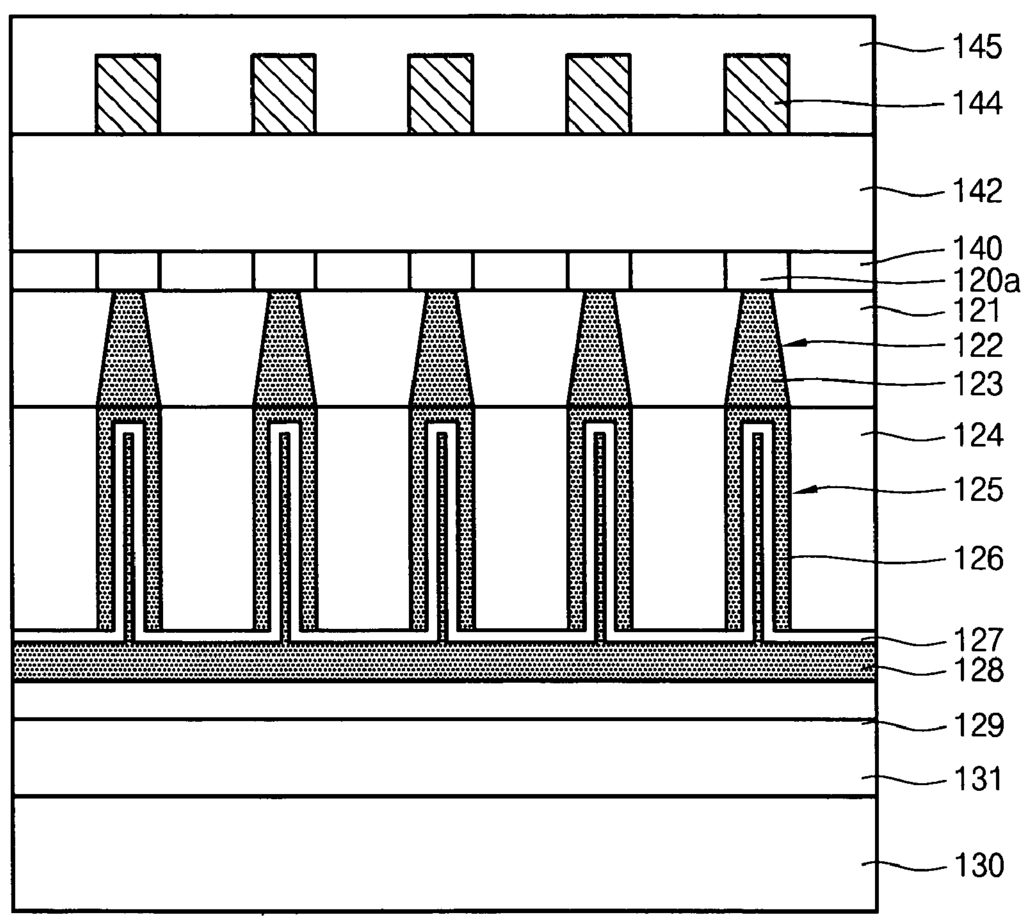

After, as shown in FIGS. 13*i* and 14*i*, the fourth insulating layer is selectively etched so as to form a bit line contact 143 for exposing the active region, and a bit line 144 filing the bit line contact 143 is formed. Subsequently, a fifth insulating layer 145 is formed such that the fifth insulating layer 145 covers a structure of the bit line.

Figure 15:
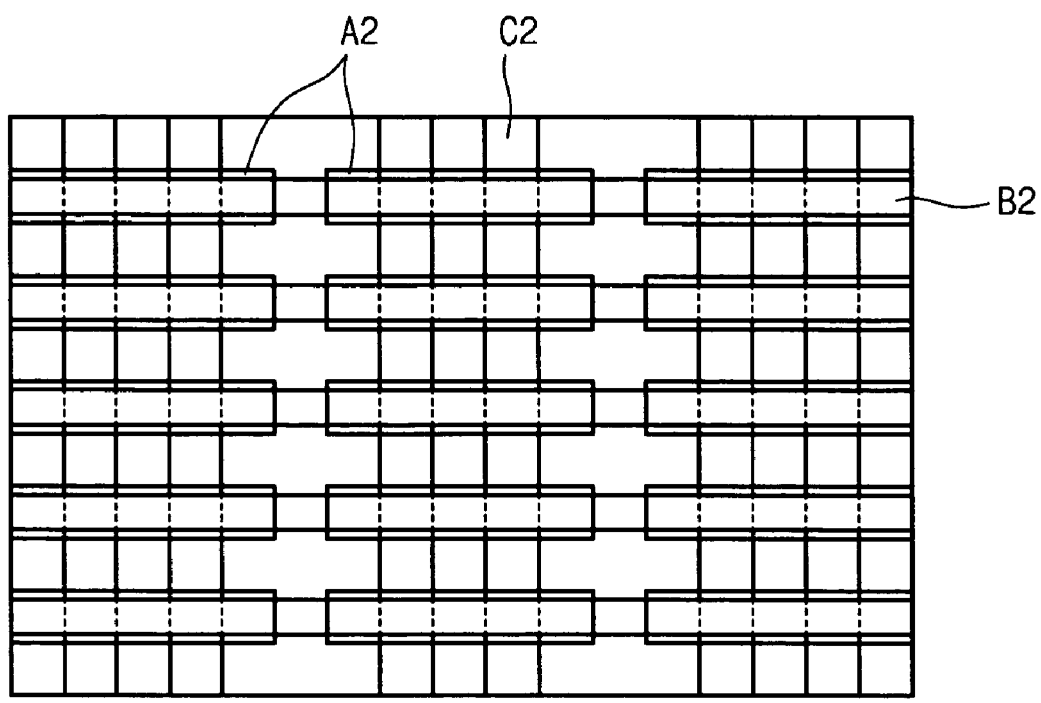
FIG. 15 is a plan view showing that active regions are uniformly aligned in match with columns and rows.

FIG. 15 is a plan view showing that active regions are uniformly aligned in match with rows and columns.

As shown in FIG. 15, according to the second embodiment of the present invention, similarly to the first embodiment of the present invention, active regions (A2) are uniformly aligned in match with rows and columns, so that it is possible to fabricate a cell with a compact size as compared with a cell fabricated through the conventional method in which the active regions of each column are offset from each other regardless of rows. Reference numerals B2 and C2 represent a bit line and a gate line, respectively.

According to the second embodiment of the present invention, after fabricating a capacitor, an isolation process is performed. After that, a gate line process and a bit line process are sequentially performed. Therefore, it is unnecessary to perform a process for forming an additional landing plug connected to a source region in order to form the bit line. Also, the bit line contact forming process is performed at a time without considering a cell area and a peripheral circuit area.

As described above, according to the present invention, after bonding a first surface of a first substrate having a gate line and a capacitor formed thereon to a second substrate, an isolation process is performed with respect to the second surface of the first substrate. After that, a bit line is formed. Accordingly, it is unnecessary to perform a process for forming an additional landing plug connected to a source region in order to form the bit line, so that a process for manufacturing a semiconductor device is simplified. Also, the bit line contact forming process is performed at a time without considering a cell area and a peripheral circuit, so that the process for manufacturing the semiconductor device is further simplified.

Also, according to the present invention, active regions of each column are uniformly aligned in match with each row, so that it is possible to fabricate a cell with a compact size as compared with a cell formed through the conventional method in which the active regions of each column are offset from each other regardless of rows.

In addition, according to the present invention, since it is unnecessary to form an insulating spacer at a side of a bit line in order to prevent a capacitor from being subject to a circuit-short in relation to the bit line in a process of connecting the capacitor to a drain region, an insulating spacer forming process of the bit line can be omitted.

Meanwhile, according to the present invention, after fabricating a capacitor, an isolation process is performed. After that, a gate line process and a bit line process are sequentially performed. Accordingly, it is unnecessary to perform a process for forming an additional landing plug connected to a source region in order to form the bit line, so that a process for manufacturing a semiconductor device is simplified. Also, the bit line contact forming process is performed at a time without considering a cell area and a peripheral circuit area, so that a process for manufacturing a semiconductor device is further simplified.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:

i) providing a first substrate and a second substrate;

ii) forming a capacitor on a first surface of the first substrate;

iii) forming an insulating layer on a resultant structure of the first substrate;

iv) bonding the second substrate to the insulating layer of the first substrate;

v) turning over a resultant structure in such a manner that a second surface of the first substrate is an upper surface of the resultant structure;

vi) polishing the second surface of the first substrate by a predetermined thickness;

vii) forming an isolation layer defining an active region by performing an isolation process with respect to the second surface of the first substrate for which a polishing process is carried out; and viii) forming a bit line on the active region in the first substrate.

2. The method as claimed in claim 1, wherein the second substrate is any one selected from a group consisting of a silicon wafer, a glass substrate, and a plastic substrate.

3. The method as claimed in claim 1, wherein the active region is patterned in such a manner that the active region of each column is uniformly aligned in match with each row.

4. The method as claimed in claim 1, wherein, in step ii), a gate line is formed with the capacitor.

5. The method as claimed in claim 1, wherein, in step viii), a gate line is formed with the bit line.

6. A method for manufacturing a semiconductor device, the method comprising the steps of:

i) providing a first substrate and a second substrate;

ii) forming a capacitor and a gate line on a first surface of the first substrate;

iii) forming an insulating layer on a resultant structure of the first substrate;

iv) bonding the second substrate to the insulating layer of the first substrate;

v) turning a resultant structure over in such a manner that a second surface of the first substrate is an upper surface of the resultant structure;

vi) polishing the second surface of the first substrate by a predetermined thickness;

vii) forming an isolation layer for defining an active region by performing an isolation process with respect to the second surface of the first substrate for which an polishing process is finished; and viii) forming a bit line on the active region in the first substrate.

7. The method as claimed in claim 6, wherein the second substrate is any one selected from a group consisting of a silicon wafer, a glass substrate, and a plastic substrate.

8. The method as claimed in claim 6, wherein the active region is patterned in such a manner that the active region of each column is uniformly aligned in match with each row.

9. A method for manufacturing a semiconductor device, the method comprising the steps of:

i) providing a first substrate and a second substrate;

ii) forming a capacitor on a first surface of the first substrate;

iii) forming a first insulating layer on the first substrate including the capacitor iv) bonding the second substrate to the first insulating layer of the first substrate;

v) turning a resultant structure over in such a manner that a second surface of the first substrate is an upper surface of the resultant structure;

vi) polishing the second surface of the first substrate by a predetermined thickness;

vii) forming an isolation layer for defining an active region by performing an isolation process with respect to the first substrate in which a polishing process is finished; and viii) forming sequentially a bit line and a gate line on the active region in the first substrate.

10. The method as claimed in claim 9, wherein the second substrate is any one selected from a group consisting of a silicon wafer, a glass substrate, and a plastic substrate.

11. The method as claimed in claim 9, wherein the active region is patterned in such a manner that the active region of each column is uniformly aligned in match with each row.

* * * * *